US011861092B2

(12) United States Patent
Bok et al.

(10) Patent No.: US 11,861,092 B2
(45) Date of Patent: *Jan. 2, 2024

(54) DISPLAY DEVICE

(71) Applicant: SAMSUNG DISPLAY CO., LTD., Yongin-si (KR)

(72) Inventors: Seunglyong Bok, Yongin-si (KR); Mugyeom Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/986,718

(22) Filed: Nov. 14, 2022

(65) Prior Publication Data
US 2023/0069851 A1 Mar. 9, 2023

Related U.S. Application Data

(63) Continuation of application No. 16/420,660, filed on May 23, 2019, now Pat. No. 11,500,484, which is a (Continued)

(30) Foreign Application Priority Data

Mar. 21, 2016 (KR) ........................ 10-2016-0033302

(51) Int. Cl.
*G06F 3/041* (2006.01)
*G06F 3/044* (2006.01)
(Continued)

(52) U.S. Cl.
CPC ........ *G06F 3/0412* (2013.01); *G02F 1/13338* (2013.01); *G06F 3/0443* (2019.05);
(Continued)

(58) Field of Classification Search
CPC .... G06F 3/0412; G06F 3/0443; G06F 3/0445; G06F 3/0446; G06F 2203/04105;
(Continued)

(56) References Cited

U.S. PATENT DOCUMENTS 7,683,387 B2 3/2010 Lee
8,174,839 B2 5/2012 Kim et al.
(Continued)

FOREIGN PATENT DOCUMENTS

CN 101207138 A 6/2008
CN 101739187 A 6/2010
(Continued)

OTHER PUBLICATIONS

Chinese Office Action for Application No. 201710169205.6 dated Jun. 15, 2020.
(Continued)

*Primary Examiner* — Jonathan A Boyd
(74) *Attorney, Agent, or Firm* — CANTOR COLBURN LLP

(57) ABSTRACT

A display device includes a display substrate in which a plurality of sub-pixel areas is defined, a light-emitting diode ("LED") on the display substrate, a touch sensor electrode on the display substrate and including at least one touch electrode, and a bank separating the plurality of the sub-pixel areas, where each of the plurality of the sub-pixel areas may include a first area in which the LED is disposed and a second area in which the touch sensor electrode is disposed.

24 Claims, 17 Drawing Sheets

Related U.S. Application Data continuation of application No. 15/373,877, filed on Dec. 9, 2016, now Pat. No. 10,338,712.

(51) Int. Cl.
*H10K 59/40* (2023.01)
*H10K 59/122* (2023.01)
*H10K 59/123* (2023.01)
*H10K 59/124* (2023.01)
*H10K 59/121* (2023.01)
*G02F 1/1333* (2006.01)
*H01L 27/12* (2006.01)
*H01L 27/15* (2006.01)

(52) U.S. Cl.
CPC .......... *G06F 3/0445* (2019.05); *G06F 3/0446* (2019.05); *H01L 27/1248* (2013.01); *H01L 27/156* (2013.01); *H10K 59/122* (2023.02); *H10K 59/123* (2023.02); *H10K 59/124* (2023.02); *H10K 59/1213* (2023.02); *H10K 59/40* (2023.02); *G06F 2203/04105* (2013.01); *G06F 2203/04111* (2013.01)

(58) Field of Classification Search
CPC .......... G06F 2203/04111; G06F 3/044; G02F 1/13338; H01L 27/1248; H01L 27/156; H10K 59/1213; H10K 59/122; H10K 59/123; H10K 59/124; H10K 59/40; G09F 9/33; G09G 3/32
See application file for complete search history.

(56) References Cited

U.S. PATENT DOCUMENTS

| | | | |
|---|---|---|---|
| 8,284,171 | B2 | 10/2012 | Tanaka et al. |
| 8,288,784 | B2 | 10/2012 | Cho |
| 8,333,860 | B1 | 12/2012 | Bibl et al. |
| 8,629,842 | B2 | 1/2014 | Jang |
| 8,796,702 | B2 | 8/2014 | Kim et al. |
| 8,872,206 | B2 | 10/2014 | Chung et al. |
| 8,928,021 | B1 | 1/2015 | Bibl et al. |
| 8,928,597 | B2 | 1/2015 | Jang |
| 8,970,539 | B2 | 3/2015 | Kwon et al. |
| 8,987,765 | B2 | 3/2015 | Bibl et al. |
| 9,029,880 | B2 | 5/2015 | Sakariya et al. |
| 9,240,396 | B2 | 1/2016 | Fan et al. |
| 9,297,831 | B2 | 3/2016 | Ahn et al. |
| 9,619,063 | B2 | 4/2017 | Wei et al. |
| 9,823,766 | B2 | 11/2017 | Li et al. |
| 9,857,923 | B2 | 1/2018 | Yun et al. |
| 11,500,484 | B2 * | 11/2022 | Bok ...................... H10K 59/123 |
| 2010/0007626 | A1 | 1/2010 | Lai ...................... G06F 3/0446 |
| | | | 345/174 |
| 2010/0108409 | A1 | 5/2010 | Tanaka et al. |
| 2011/0234530 | A1 | 9/2011 | Kim et al. |
| 2012/0104422 | A1 | 5/2012 | Lee et al. |
| 2012/0105359 | A1 | 5/2012 | Kim et al. |
| 2014/0049704 | A1 | 2/2014 | Yao ...................... G02F 1/13338 |
| | | | 349/12 |
| 2014/0145156 | A1 | 5/2014 | Choi ...................... H01L 27/3279 |
| | | | 257/40 |
| 2014/0159064 | A1 | 6/2014 | Sakariya et al. |
| 2014/0339495 | A1 | 11/2014 | Bibl ...................... H01L 33/504 |
| | | | 257/13 |
| 2014/0346027 | A1 | 11/2014 | Li et al. |
| 2015/0185940 | A1 | 7/2015 | Han et al. |
| 2015/0331508 | A1 | 11/2015 | Nho ...................... H01L 27/323 |
| | | | 345/173 |
| 2016/0011705 | A1 | 1/2016 | Huang ...................... G06F 3/044 |
| | | | 345/174 |

FOREIGN PATENT DOCUMENTS

| | | |
|---|---|---|
| CN | 101813843 A | 8/2010 |
| CN | 101814459 A | 8/2010 |
| CN | 103560140 A | 2/2014 |
| CN | 103713792 A | 4/2014 |
| CN | 103907081 A | 7/2014 |
| CN | 104182072 A | 12/2014 |
| CN | 104698701 A | 6/2015 |
| CN | 104779267 A | 7/2015 |
| CN | 104838508 A | 8/2015 |
| CN | 104871231 A | 8/2015 |
| CN | 204650473 U | 9/2015 |
| CN | 105324858 A | 2/2016 |
| KR | 1020070049007 A | 5/2007 |
| KR | 1020100007717 A | 1/2010 |
| KR | 100962253 B1 | 6/2010 |
| KR | 1020110024531 A | 3/2011 |
| KR | 101058109 B1 | 8/2011 |
| KR | 1020110108711 A | 10/2011 |
| KR | 101124397 B1 | 2/2012 |
| KR | 1020120038824 A | 4/2012 |
| KR | 1020120045581 A | 5/2012 |
| KR | 1020120073140 A | 7/2012 |
| KR | 1020150077828 A | 7/2015 |
| KR | 1020160017336 A | 2/2016 |
| WO | 2010041879 A2 | 4/2010 |
| WO | 2015175013 A1 | 11/2015 |

OTHER PUBLICATIONS

Chinese Office Action for Application No. 201710169205.6 dated Mar. 10, 2021.
Korean Office Action for Application. 10-2016-0033302 dated Jul. 7, 2022.

* cited by examiner

DISPLAY DEVICE

This application is a continuation of U.S. patent application Ser. No. 16/420,660, filed on May 23, 2019, which is a continuation of U.S. patent application Ser. No. 15/373,877, filed on Dec. 9, 2016, which claims priority to Korean Patent Application No. 10-2016-0033302, filed on Mar. 21, 2016, and all the benefits accruing therefrom under 35 U.S.C. § 119, the content of which in its entirety is herein incorporated by reference.

BACKGROUND

1. Field

One or more exemplary embodiments relate to a display device.

2. Description of the Related Art

A light-emitting diode ("LED") is one type of a semiconductor element, that is, a p-n junction diode, in which holes and electrons are injected when a forward bias is applied thereto and energy generated by recombination of the holes and electrons is transformed into light.

The LED may be used in various types of mobile devices such as a smart phone, a lap top computer, a digital camera, a camcorder, a mobile information terminal, a tablet personal computer and a watch, and in various types of electronic devices such as a desk top computer, a television ("TV") set, an outdoor advertisement board, an exhibition display device, an automobile instrument panel and a head up display ("HUD").

SUMMARY

One or more exemplary embodiments include a display device which displays images via light-emitting diodes ("LEDs") and has touch functions that can be performed via a touch screen.

Additional exemplary embodiments will be set forth in part in the description which follows and, in part, will be apparent from the description, or may be learned by practice of the presented exemplary embodiments.

According to an exemplary embodiment of the invention, a display device may include a display substrate having a plurality of sub-pixel areas, an LED above the display substrate, a touch sensor electrode above the display substrate and including at least one touch electrode, and a bank separating the sub-pixel areas, where each of the plurality of the sub-pixel areas may include a first area in which the LED is disposed and a second area in which the touch sensor electrode is disposed.

According to one or more exemplary embodiments, each of the plurality of the sub-pixel areas may be positioned in an opening surrounded by the bank, and the first area in which the LED arranged is disposed and the second area in which the touch sensor electrode is disposed may be adjacent to each other in each sub-pixel area.

According to one or more exemplary embodiments, the LED may include a first contact electrode, a second contact electrode, and a p-n diode arranged between the first and second contact electrodes, where the first contact electrode may be arranged on a bottom portion of the LED and electrically connected to a first electrode connected to a thin film transistor, and the second contact electrode may be electrically connected to a second electrode arranged on a top portion of the LED.

According to one or more exemplary embodiments, the touch sensor electrode and the first electrode may be arranged on the same layer.

According to one or more exemplary embodiments, the touch sensor electrode and the second electrode may be arranged on the same layer.

According to one or more exemplary embodiments, a filling layer embedding the LED may fill the opening and the touch sensor electrode may be arranged on the filling layer.

According to one or more exemplary embodiments, the touch sensor electrode may include an electrode operating in a self-capacitance method and sense a capacitance change of a single touch electrode, and touch sensor wirings may be respectively and electrically connected to the touch sensor electrode and reciprocally exchange electrical signals of the touch sensor electrodes with an external device.

According to one or more exemplary embodiments, the touch sensor electrode and the first electrode may be arranged on the same layer, a filling layer may be arranged in the opening, the LED and the touch sensor electrode being embedded in the filling layer, and the touch sensor wiring electrically connected to the touch sensor electrode via a contact hole may be arranged on the filling layer.

According to one or more exemplary embodiments, the filling layer may be arranged in the opening, the LED being embedded in the filling layer, the touch sensor electrode may be arranged on the filling layer, the touch sensor electrode and the second electrode may be on the same layer, and the touch sensor wiring may be arranged on the touch sensor electrode.

According to one or more exemplary embodiments, the touch sensor electrode may include an electrode operating in a mutual-capacitance method and sense a capacitance change occurring between a first touch electrode and a second touch electrode.

According to one or more exemplary embodiments, the first and second touch electrodes and the first or second electrodes may be arranged on the same layer.

According to one or more exemplary embodiments, a plurality of first touch electrodes may be electrically connected via connecting wirings arranged on a different layer with respect to the first touch electrode, and the second touch electrode may be electrically connected to respective touch sensor wirings.

According to one or more exemplary embodiments, the first and second touch electrodes may be separated on different layers.

According to one or more exemplary embodiments, the first touch electrode and at least one of a gate electrode, a source electrode, and a drain electrode, which are provided in the thin film transistor, may be arranged on the same layer, and the second touch electrode and the first or second electrodes may be arranged on the same layer.

According to one or more exemplary embodiments, the touch sensor electrode may include an electrode which senses capacitance changes along an X-axis and a Y-axis crossing the X-axis, and a force sensing electrode which senses, together with the touch sensor electrode, a capacitance change along a Z-axis perpendicular to the X-axis and the Y-axis may be arranged on the display substrate.

According to one or more exemplary embodiments, at least one of function layers covering the sub-pixel area may be arranged above the display substrate and the force sensing electrode may be arranged above the at least one of the function layer.

According to one or more exemplary embodiments, the force sensing electrode may include a conductive polymer material.

According to one or more exemplary embodiments, a refractive index matching layer having a refractive index less than that of the force sensing electrode may be arranged on at least one surface of the force sensing electrode.

According to one or more exemplary embodiments, the bank may include a first bank and a second bank arranged on the first bank, the LED may be arranged in an opening surrounded by the first bank, the second bank surrounding the LED may be arranged on the first bank, and the second electrode may be electrically connected to the LED on the second bank.

According to one or more exemplary embodiments, the thin film transistor arranged on a bottom portion of the sub-pixel area may include a gate electrode, a source electrode, and a drain electrode, the first touch electrode and at least one of the first electrode, the gate electrode, the source electrode, and the drain electrode may be arranged on the same layer, and the second touch electrode and the second electrode may be arranged on the same layer.

BRIEF DESCRIPTION OF THE DRAWINGS

These and/or other exemplary embodiments will become apparent and more readily appreciated from the following description of the exemplary embodiments, taken in conjunction with the accompanying drawings in which.

DETAILED DESCRIPTION

Figure 1:
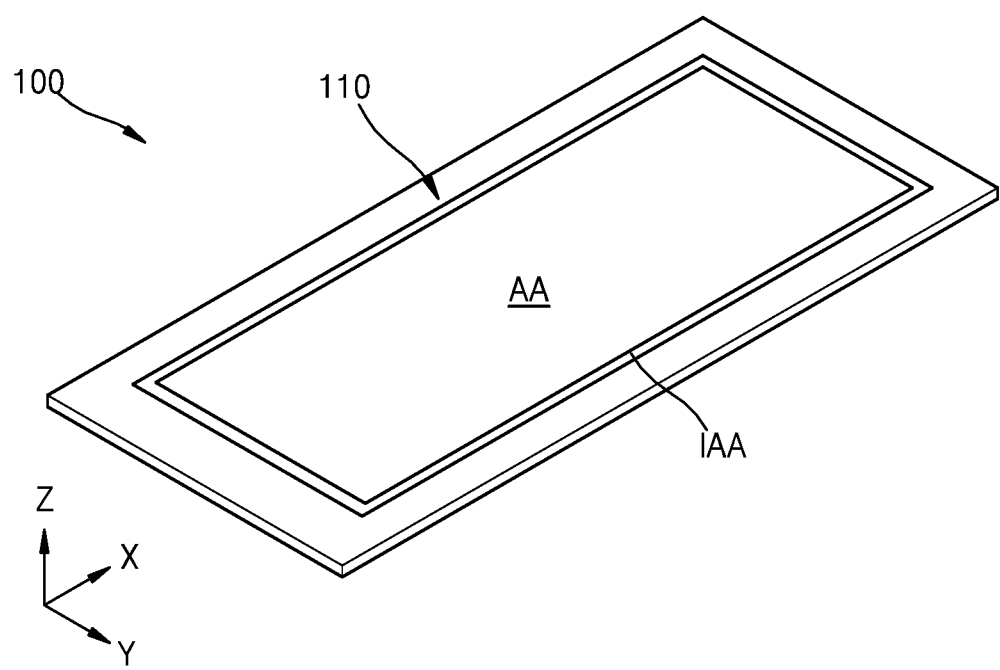
FIG. 1 is a perspective view of an exemplary embodiment of a display device.

Reference will now be made in detail to exemplary embodiments, examples of which are illustrated in the accompanying drawings, in which like reference numerals refer to like elements throughout. In this regard, the exemplary embodiments may have different forms and should not be construed as being limited to the descriptions set forth herein. Accordingly, the exemplary embodiments are merely described below, by referring to the figures, to explain exemplary embodiments of the description. Expressions such as "at least one of," when preceding a list of elements, modify the entire list of elements and do not modify the individual elements of the list.

As the invention allows for various changes and numerous exemplary embodiments, exemplary embodiments will be illustrated in the drawings and described in detail in the written description. However, this is not intended to limit the invention to particular modes of practice, and it is to be appreciated that all changes, equivalents, and substitutes that do not depart from the spirit and technical scope of the invention are encompassed in the invention. In the description of the invention, certain detailed explanations of the related art are omitted when it is deemed that they may unnecessarily obscure the essence of the invention.

It will be understood that when an element is referred to as being "on" another element, it can be directly on the other element or intervening elements may be therebetween. In contrast, when an element is referred to as being "directly on" another element, there are no intervening elements present.

While such terms as "first," "second," etc., may be used to describe various components, such components must not be limited to the above terms. The above terms are used only to distinguish one component from another.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

The terms used in the specification are merely used to describe exemplary embodiments, and are not intended to limit the invention. An expression used in the singular encompasses the expression of the plural, unless it has a clearly different meaning in the context. In the specification, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

The invention will now be described more fully with reference to the accompanying drawings, in which exemplary embodiments of the invention are shown. Like reference numerals in the drawings denote like elements, and thus their repetitive description will be omitted.

FIG. 1 is a perspective view of a display device 100 according to an exemplary embodiment.

Referring to FIG. 1, the display device 100 may include a display panel 110. The display panel 110 may include an active area AA displaying images and an inactive area IAA extending outwardly from the active area AA. According to an exemplary embodiment, the inactive area IAA may surround the active area AA.

According to an exemplary embodiment, the active area AA may extend in a longitudinal direction of the display panel 110, but the invention is not limited thereto. According to an exemplary embodiment, the display panel 110 may be a rigid or flexible panel.

The display device 100 may include a touch screen panel ("TSP") which recognizes a location where a user contacts the display device 100.

Figure 2:
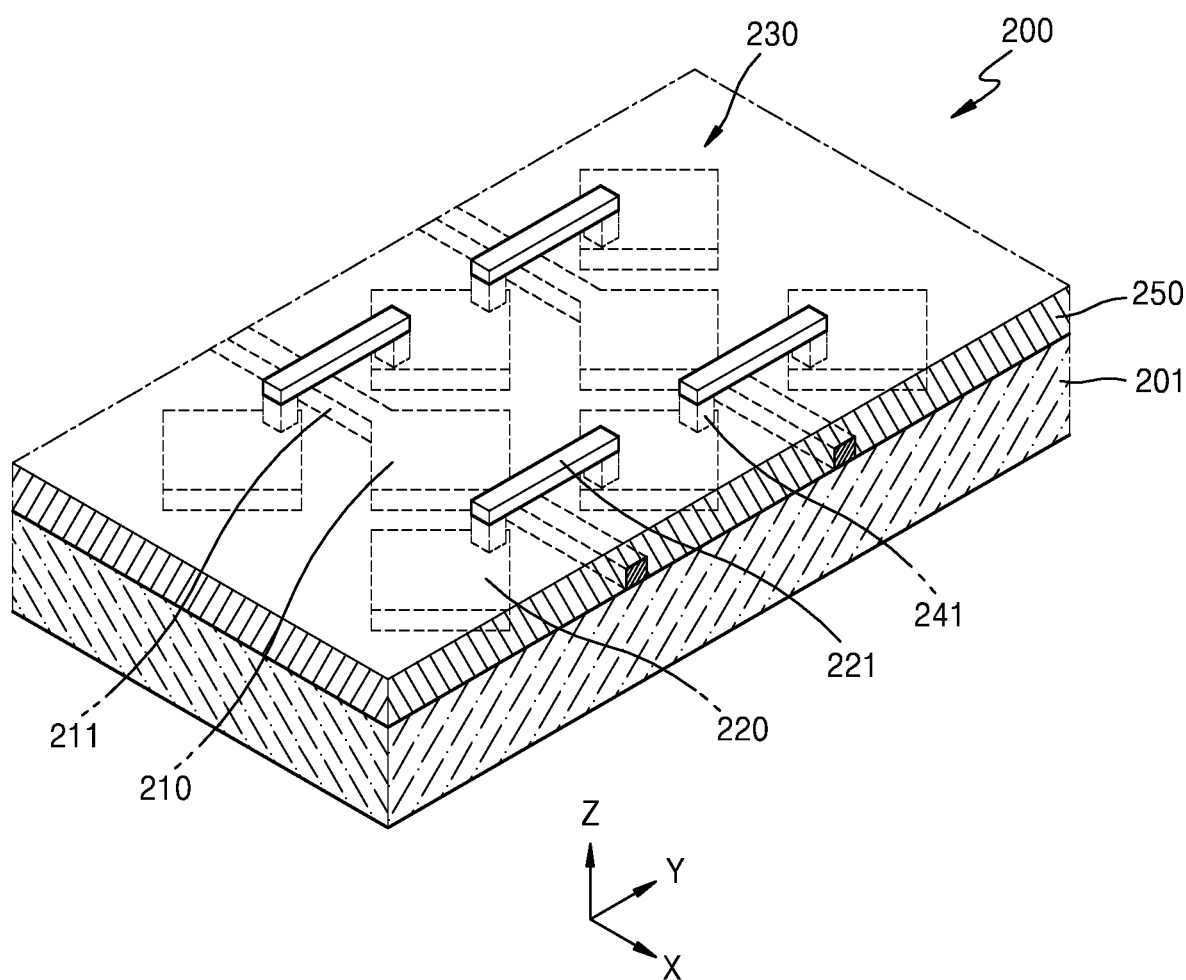
FIG. 2 is a partially exploded perspective view of an exemplary embodiment of a touch screen panel.

FIG. 2 is a partially exploded perspective view of the TSP 200 according to an exemplary embodiment.

Referring to FIG. 2, the TSP 200 may include a plurality of touch sensor electrodes 230. The plurality of touch sensor electrodes 230 may include a plurality of first touch electrodes 210 and a plurality of second touch electrodes 220.

According to an exemplary embodiment, the TSP 200 is an on-cell TSP in which the plurality of touch sensor electrodes 230 is arranged in the display panel 110 in FIG. 1. However, a structure of the TSP is not limited thereto.

According to another exemplary embodiment, the TSP 200 may have an in-cell TSP structure in which the plurality of touch sensor electrodes 230 are arranged inside the display panel 110 in FIG. 1 or a hybrid TSP structure, which is a combination of the on-cell TSP and the in-cell TSP structures, for example. Thus, the structure of the TSP is not limited to only one type.

The plurality of first touch electrodes 210 and the plurality of second touch electrodes 220 may be alternately arranged relative to each other on a substrate 201. The substrate 201 may be an encapsulated substrate arranged in the display panel 110 in FIG. 1. The plurality of first touch electrodes 210 and the plurality of second touch electrodes 220 may be arranged in directions crossing each other. Each of the first touch electrodes 210 may be a transmission electrode and each of the second touch electrodes 220 may be a reception electrode.

According to an exemplary embodiment, the TSP 200 may have a mutual-capacitance sensing structure, in which capacitance changes are measured at points where the plurality of touch sensor electrodes 230 cross each other. However, the structure of the TSP 200 is not limited thereto. According to another exemplary embodiment, the structure of the TSP 200 may be a self-capacitance sensing structure, in which the capacitance change is measured at each pixel for touch recognition via a single touch sensor electrode 230. Thus, the structure of the TSP 200 is not limited to one type only.

The plurality of first touch electrodes 210 and the plurality of second touch electrodes 220 may be arranged on the same layer on the substrate 201. In another exemplary embodiment, the plurality of first touch electrodes 210 and the plurality of second touch electrodes 220 may be separated from each other on different layers.

A pair of the first touch electrodes 210 arranged adjacent to each other on the substrate 201 may be electrically connected to each other via a first touch connector 211. A pair of the second touch electrodes 220 arranged adjacent to each other on the substrate 201 may be electrically connected to each other via a second touch connector 221. A pair of the second touch electrodes 220 may be connected to the second touch connector 221 arranged on a different layer via a contact hole 241, to avoid interference with the first touch electrode 210.

An insulating layer 250 covering the plurality of first touch electrodes 210 and the plurality of second touch electrodes 220 may be arranged on the substrate 201.

When an input tool such as a user's finger or a pen comes close to or contacts the substrate 201, the TSP 200 may detect a touch location by measuring a capacitance change between the first touch electrode 210 and the second touch electrode 220.

Research and development on a display device including a TSP with a plurality of micro-LEDs has been conducted.

Figure 3:
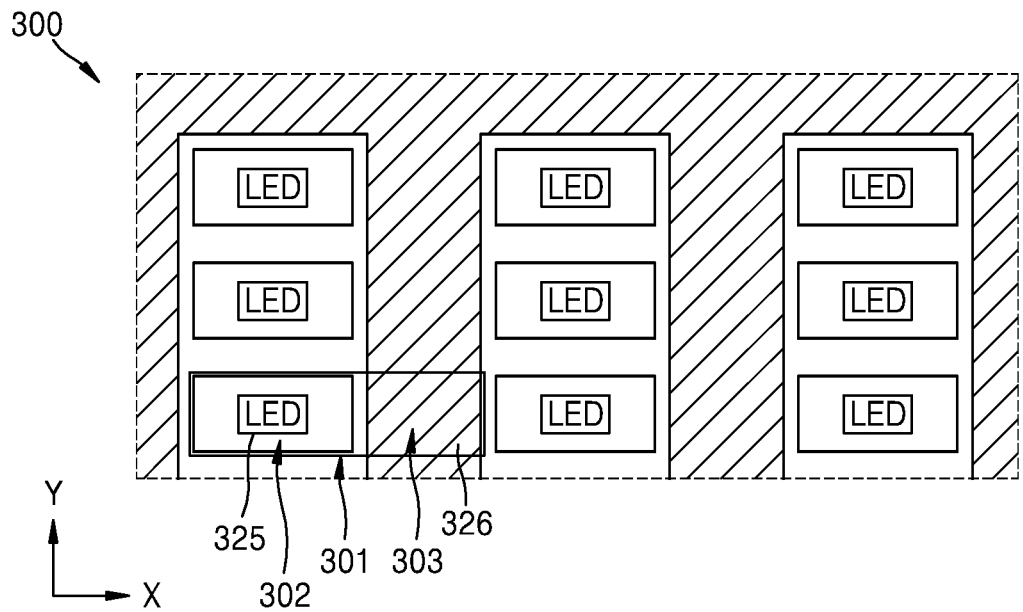
FIG. 3 is a plan view of the display device, showing an exemplary embodiment of an arrangement of a light-emitting diode ("LED") and a touch sensor electrode.
Figure 4:
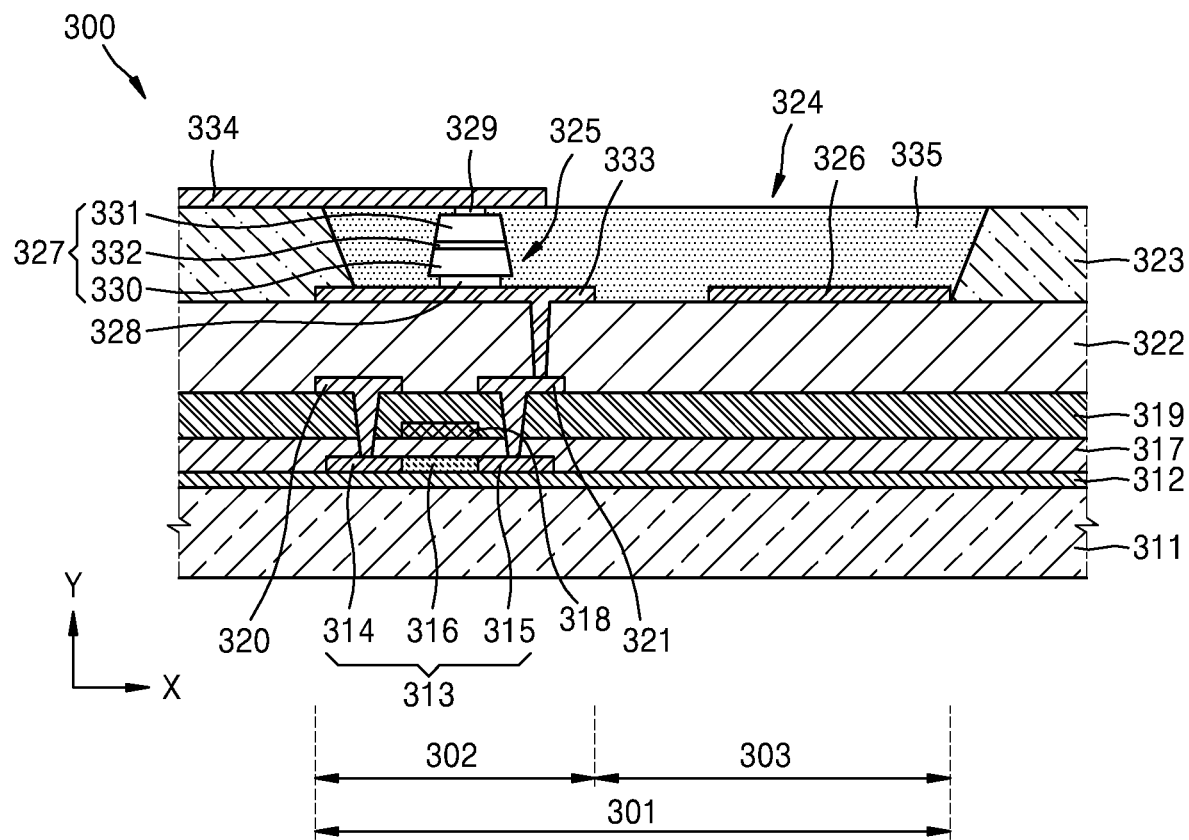
FIG. 4 is a cross-sectional view of a single sub-pixel in FIG. 3.

FIG. 3 is a plan view of an arrangement of a LED 325 and a touch sensor electrode 326 of a display device 300 according to an exemplary embodiment. FIG. 4 is a cross-sectional view of a single sub-pixel of the display device 300 of FIG. 3.

According to an exemplary embodiment, each of sub-pixels of the display device 300 may include at least one thin film transistor ("TFT") and at least one micro-LED. However, the TFT is not necessarily feasible only in the structure of FIG. 3, and its number and structure may be variously changeable.

Referring to FIGS. 3 and 4, the display device 300 may include a plurality of sub-pixel areas 301. The sub-pixel areas 301 may be separated from each other in the X-axis and the Y-axis directions on a display substrate 311. The sub-pixel areas 301 may be separated from each other by at least one layer of a bank 323. The sub-pixel area 301 may include a first area 302 in which the LED 325 is disposed (e.g., placed) and a second area 303 in which a touch sensor electrode 326 is placed.

In an exemplary embodiment, the display substrate 311 may be any one of a rigid glass substrate, a flexible glass substrate, and a flexible polymer substrate, for example. In an exemplary embodiment, the display substrate 311 may be transparent, semi-transparent, or opaque, for example.

A buffer layer 312 may be arranged on the display substrate 311. The buffer layer 312 may totally cover a top surface of the display substrate 311. The buffer layer 312 may include an inorganic layer or an organic layer. The buffer layer 312 may be a single layer or a multi-layer.

The TFT may be arranged on the buffer layer 311. The TFT may include a semiconductor activating layer 313, a gate electrode 318, a source electrode 320, and a drain electrode 321. According to an exemplary embodiment, the TFT may be a top gate type.

However, the invention is not limited thereto, and the TFT may be other types such as a bottom gate type.

The semiconductor activating layer 313 may be arranged on the buffer layer 312.

The semiconductor activating layer 313 may include a source area 314 and a drain area 315 which are positioned by doping n-type impurity ions or p-type impurity ions. An area between the source area 314 and the drain area 315 may be a channel area 316 in which impurities are not doped. In an exemplary embodiment, the semiconductor activating layer 313 may be an organic semiconductor, an inorganic semiconductor, or amorphous silicon, for example. In another exemplary embodiment, the semiconductor activating layer 313 may be an oxide semiconductor, for example.

A gate insulating layer 317 may be arranged on the semiconductor activating layer 313. The gate insulating layer 317 may include an inorganic layer. The gate insulating layer 317 may be a single layer or a multi-layer.

The gate electrode 318 may be arranged on the gate insulating layer 317. The gate electrode 318 may include a material with good conductivity. The gate electrode 318 may be a single layer or a multi-layer.

An interlayer insulating layer 319 may be arranged on the gate electrode 318. The interlayer insulating layer 319 may include an inorganic layer or an organic layer.

The source electrode 320 and the drain electrode 321 may be arranged on the interlayer insulating layer 319. In detail, a contact hole may be defined by removing a portion of the gate insulating layer 317 and a portion of the interlayer insulating layer 319. Then, the source electrode 320 may be electrically connected to the source area 314 via the contact hole and the drain electrode 321 may be electrically connected to the drain area 315 via the contact hole.

A planarization layer 322 may be arranged on the source electrode 320 and the drain electrode 321. The planarization layer 322 may include an inorganic layer or an organic layer.

At least one layer of the bank 323 separating the sub-pixel areas 301 may be arranged on the planarization layer 322. The bank 323 may include an inorganic layer or an organic layer. The bank 323 may be transparent or opaque. The bank 323 may include a light absorbing material, a light reflecting material, or a light scattering material. The bank 323 may function as a light blocking layer having low light transmissivity.

An opening 324 may be defined above the TFT by removing a portion of the bank 323. A first electrode 333 may be arranged on the planarization layer 322 which is exposed by removing the portion of the bank 323. The first electrode 333 may be electrically connected to the drain electrode 321 via the contact hole defined in the planarization layer 322. The first electrode 333 may include a transparent electrode or a metal electrode. The first electrode 333 may have various patterns. In an exemplary embodiment the first electrode 333 may be patterned in an island shape, for example.

The sub-pixel area 301 may include the first area 302 in which the LED 325 is placed and the second area 303 in which the touch sensor electrode 326 is placed. The LED 325 and the touch sensor electrode 326 may be arranged in the sub-pixel area 301.

In detail, each of the sub-pixel areas 301 may be positioned in the opening 324 surrounded by the bank 323. The first area 302 in which the LED 325 is placed and the second area 303 in which the touch sensor electrode 326 is placed may be arranged adjacent to each other in each of the sub-pixel areas 301. According to an exemplary embodiment, a size of the second area 303 may be larger than that of the first area 302.

The LED 325 may emit light in a certain wavelength band covering a range from ultraviolet ("UV") rays to visible light. In an exemplary embodiment, the LED 325 may be a micro-LED, for example. According to an exemplary embodiment, the LED 325 may be a red-color LED, a green-color LED, a blue-color LED, a white-color LED, or a UV LED, for example.

The LED 325 may include a first contact electrode 328, a second contact electrode 329, and a p-n diode 327 arranged between the first contact electrode 328 and the second contact electrode 329.

The p-n diode 327 may include a p-doped layer 330 on a bottom portion, an n-doped layer 331 on a top portion, and at least one of quantum well layer 332 arranged between the p-doped layer 330 and the n-doped layer 331. In another exemplary embodiment, the doped layer 331 on the top portion may be the p-doped layer and the doped layer 330 on the bottom portion may be the n-doped layer.

The first contact electrode 328 may be arranged on the p-doped layer 330 on the bottom portion. The first contact electrode 328 may be electrically connected to the first electrode 333. The second contact electrode 329 may be arranged on the n-doped layer 331 on the top portion. The second contact electrode 329 may be electrically connected to a second electrode 334. The second electrode 334 may include a transparent electrode or a metal electrode. The second electrode 334 may include various shapes of patterns. According to an exemplary embodiment, the second electrode 334 may be a common electrode.

The touch sensor electrode 326 may be arranged in the second area 303 of each of the sub-pixel areas 301. The touch sensor electrode 326 may include a metal layer. In a case of a transparent display device, the touch sensor electrode 326 may include a transparent conductive layer such as an indium tin oxide ("ITO") layer.

The touch sensor electrode 326 may be the same as the touch sensor electrode 230 in FIG. 2. The touch sensor electrode 326 may extend to an adjacent sub-pixel area 301. According to an exemplary embodiment, the touch sensor electrode 326 may be a portion of the first touch electrode 210 or the second touch electrode 220 in FIG. 2.

The touch sensor electrode 326 may be arranged on a same layer as that on which the first electrode 333 is disposed. The touch sensor electrode 326 may include the same material and be obtained via the same process as that of the first electrode 333. In other exemplary embodiment, the touch sensor electrode 326 may be patterned with another metallic material.

According to an exemplary embodiment, the touch sensor electrode 326 may be electrically connected to the first electrode 333. In another exemplary embodiment, the touch sensor electrode 326 may apply a separate electrical signal.

The touch sensor electrode 326 may be driven via a mutual-capacitance method or a self-capacitance method, depending on a connection method.

In the case of the mutual-capacitance method, the touch sensor electrode 326 may be an electrode which senses a capacitance change between the plurality of touch electrodes such as the first touch electrode 210 and the second touch electrode 220 in FIG. 2. The plurality of touch electrodes may be arranged on the same layer above the display substrate 311. In another exemplary embodiment, the plurality of touch electrodes may be separated on different layers above the display substrate 311.

In the case of the self-capacitance method, the touch sensor electrode 326 may be an electrode which senses a capacitance change of a single touch electrode by using a single touch electrode.

According to an exemplary embodiment, a ground wiring (not illustrated) may be further arranged in the second area 303 of the sub-pixel area 301.

A filling layer 335 may be filled in the opening 324. The LED 325 and the touch sensor electrode 326 may be embedded in the filling layer 335. In an exemplary embodiment, the filling layer 335 may include an organic material, but the invention is not limited thereto.

Likewise, the LED 325 may be arranged in the first area 302 of the sub-pixel area 301. The touch sensor electrode 326 may be arranged in the second area 303 of the sub-pixel area 301.

Below, like reference numbers in illustrated drawings above may denote like members performing like functions. Thus, duplicate descriptions will be omitted and only major particular portions of each exemplary embodiment will be selectively described.

Figure 5:
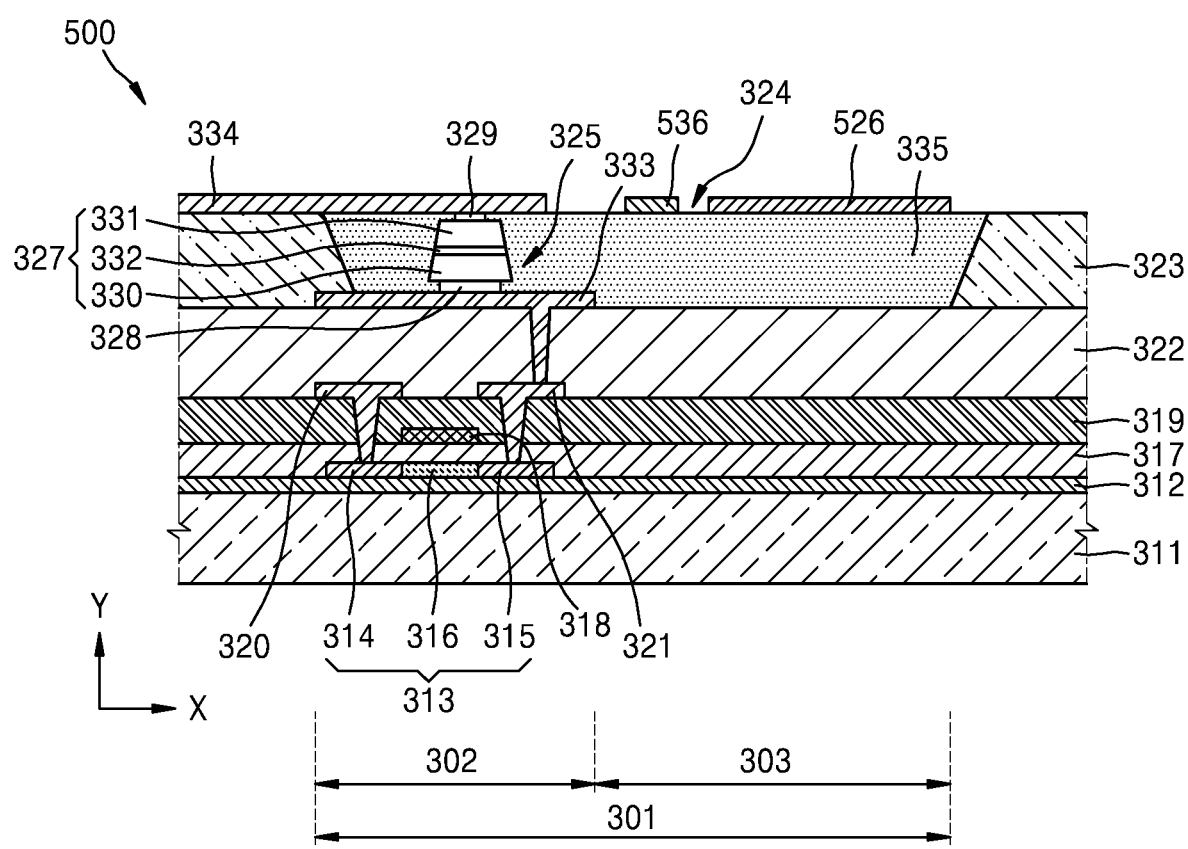
FIG. 5 is a plan view of another exemplary embodiment of a display device.

FIG. 5 is a plan view of a display device 500 according to another exemplary embodiment.

Referring to FIG. 5, the sub-pixel area 301 may include the first area 302 in which the LED 325 is placed and the second area 303 in which a touch sensor electrode 526 is placed. The filling layer 335 may be filled in the opening 324 from which a portion of the bank 323 is removed.

The LED 325 may be embedded in the filling layer 335. The touch sensor electrode 526 may be arranged on the filling layer 335. The touch sensor electrode 526 and the second electrode 334 may be arranged on the same layer. The touch sensor electrode 526 may include the same material and be obtained via the same process as that of the second electrode 334. The touch sensor electrode 526 may be driven via a mutual-capacitance method or a self-capacitance method, depending on a connection method.

According to an exemplary embodiment, a ground wiring 536 may be further arranged in the second area 303 of the sub-pixel area 301. The ground wiring 536 and the touch sensor electrode 526 may be arranged on the same layer. The ground wiring 536 may eliminate noise caused by pixel-driving. When the ground wiring 536 is arranged, a capacitance may be reduced, and subsequently, noise may be reduced.

The ground wiring 536 may receive an electrical signal from a power line, through which a constant voltage flows. In another exemplary embodiment, a ground voltage may be applied to the ground wiring 536. In another exemplary embodiment, the ground wiring 536 may be in a floating state.

Figure 6:
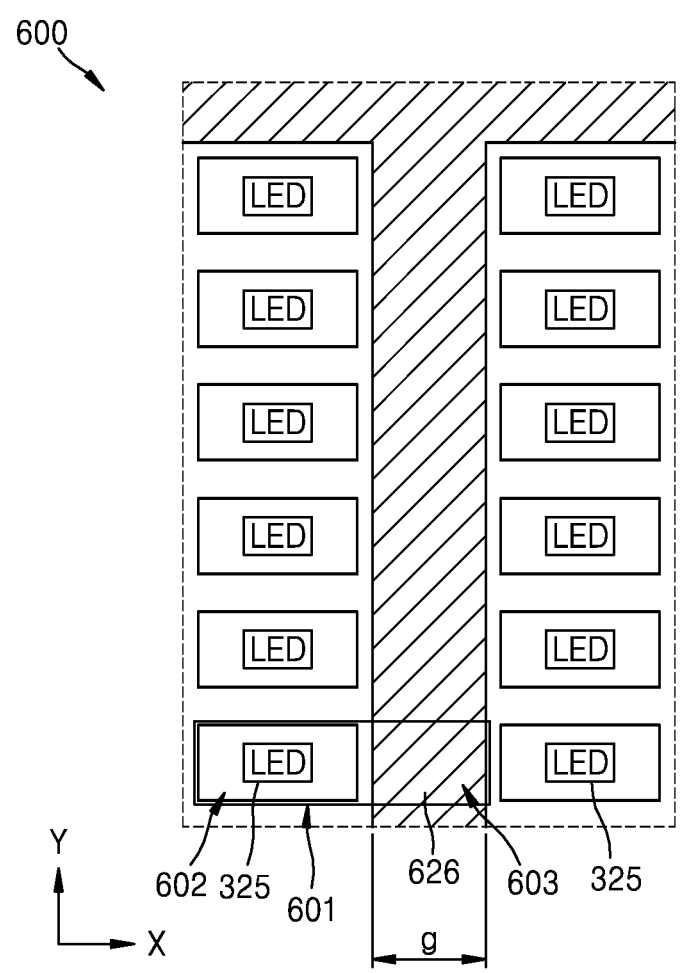
FIG. 6 is a plan view of an exemplary embodiment of an arrangement of an LED and a touch sensor electrode.

FIG. 6 is a plan view of an arrangement of the LED 325 and a touch sensor electrode 626 according to an exemplary embodiment.

Referring to FIG. 6, the LED 325 and the touch sensor electrode 626 of the display device 600 may be arranged in each of sub-pixel areas 601. Each LED 325 may be arranged in respective sub-pixel areas 601 and the touch sensor electrode 626 may extend to the adjacent sub-pixel area 601. Each of sub-pixel areas 601 may include a first area 602 in which the LED 325 is placed and a second area 603 in which a touch sensor electrode 626 is placed.

An area of the touch sensor electrode 626 may be expanded by enlarging a gap g between a pair of LEDs 325 which are involved in different light-emitting and adjacent to each other in the X-axis direction. When the area of the touch sensor electrode 626 is increased, touch sensitivity may be enhanced.

According to an exemplary embodiment, the LED 325 arranged in each sub-pixel may include at least one of the red-color LED, the green-color LED, the blue-color LED, the white-color LED, and the UV LED. In another exemplary embodiment, a color filter layer having color hue corresponding to respective LEDs 325 may be further arranged above the LED 325.

Figure 7:
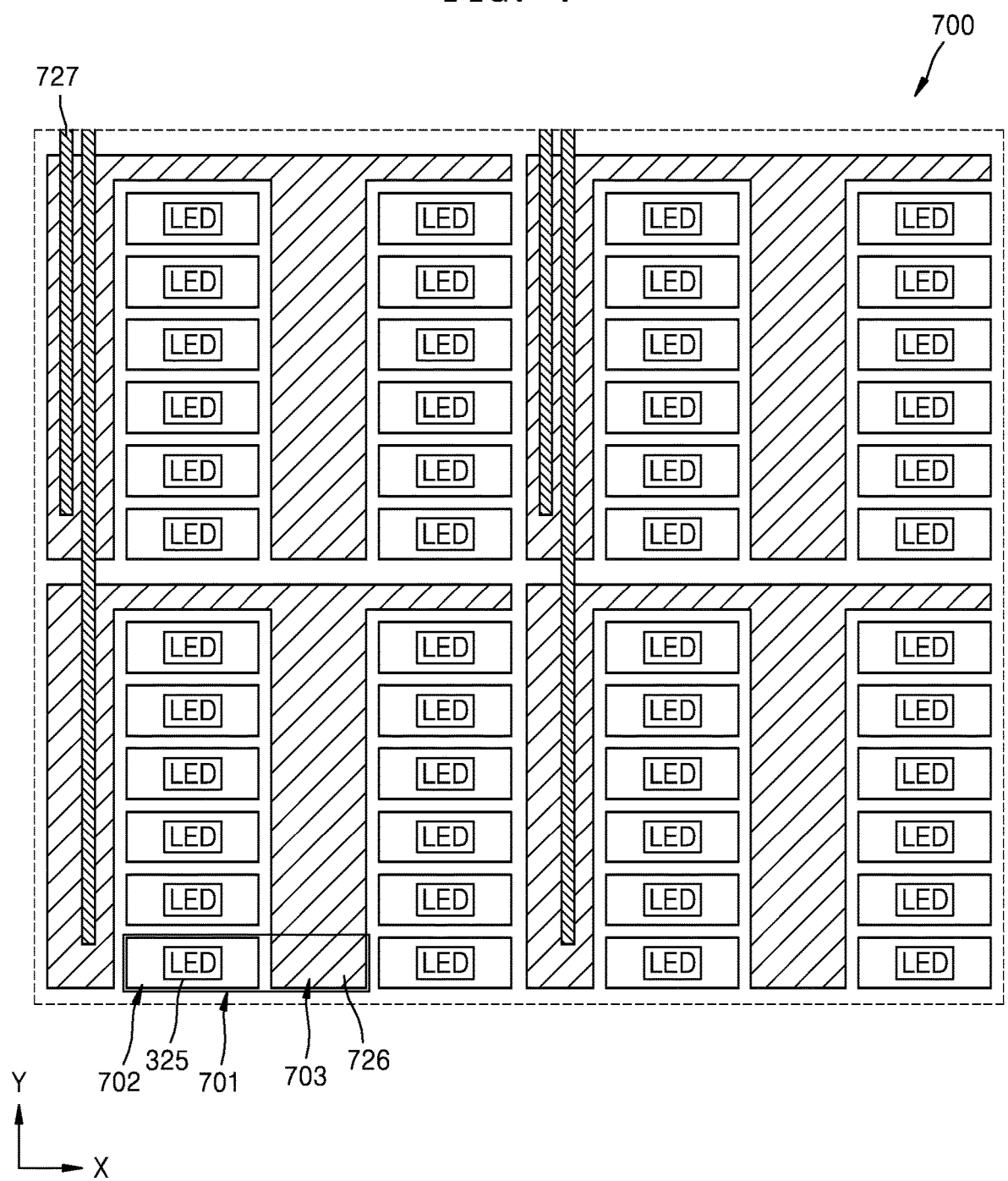
FIG. 7 is a plan view of another exemplary embodiment of an arrangement of an LED and a touch sensor electrode.

FIG. 7 is a plan view of an arrangement of an LED and a touch sensor electrode according to another exemplary embodiment.

Referring to FIG. 7, the display device 700 may include a plurality of sub-pixel areas 701. The sub-pixel areas 701 may be separated from each other in X-axis and Y-axis directions. The sub-pixel area 701 may include a first area 702 in which the LED 325 is placed and a second area 703 in which a touch sensor electrode 726 is placed. The touch sensor electrode 726 may extend to an adjacent sub-pixel area 701.

According to an exemplary embodiment, the touch sensor electrode 726 may have a self-capacitance sensing structure. The touch sensor electrode 726 may be an electrode which senses a capacitance change in a single touch electrode. A touch sensor wiring 727 may be arranged on the touch sensor electrode 726. In an exemplary embodiment a plurality of touch sensor wirings 727 may be arranged in the sub-pixel areas 701 which are arranged along the Y-axis direction, for example.

The touch sensor wiring 727 may extend along the Y-axis direction and may be electrically connected to respective touch sensor electrodes 726 which are continuously arranged in the Y-axis direction. The touch sensor wiring 727 may be electrically connected to the touch sensor electrode 726 and an external device (not illustrated). A changed capacitance may be transferred from the single touch sensor electrode 726 to the external device via the touch sensor wiring 727, and a sensor voltage generated by the external device may be transferred to the touch sensor electrode 726.

According to an exemplary embodiment, the touch sensor wiring 727 may be directly or indirectly connected to the touch sensor electrode 726 on the touch sensor electrode 726.

Figure 8:
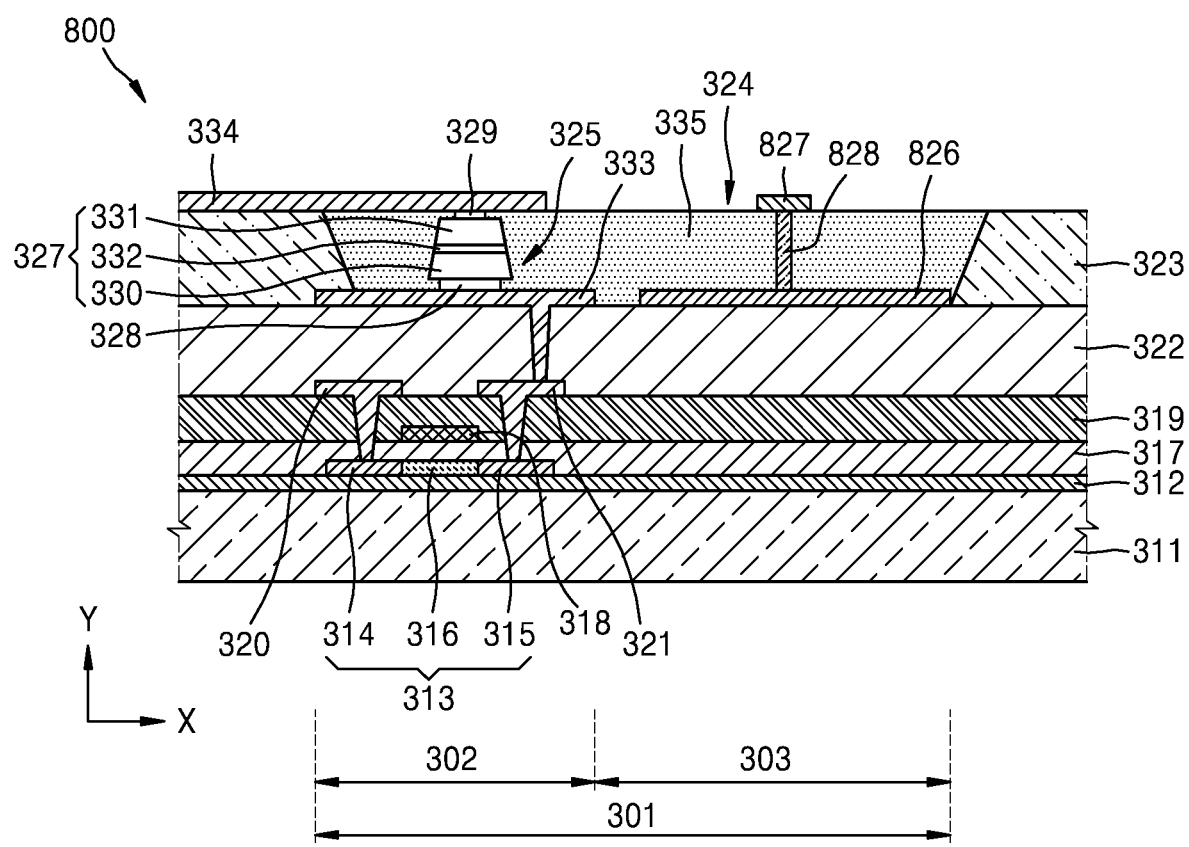
FIG. 8 is a cross-sectional view of another exemplary embodiment of a single sub-pixel.

Referring to FIG. 8, the sub-pixel area 301 of the display device 800 may include the first area 302 in which the LED 325 is placed and the second area 303 in which a touch sensor electrode 826 is placed. The filling layer 335 may be filled in the opening 324 which is defined by removing the portion of the bank 323.

The touch sensor electrode 826 and the first electrode 333 may be arranged on the same layer. A touch sensor wiring 827 may be arranged on the filling layer 335. The touch sensor wiring 827 may be arranged in the second area 303. The touch sensor wiring 827 may be electrically connected to the touch sensor electrode 826 via a contact hole 828 defined in the filling layer 335.

According to an exemplary embodiment, the touch sensor wiring 827 and at least one of the gate electrode 318, the source electrode 320, and the drain electrode 321 may be included on the same layer. However, the current exemplary embodiment is not limited to a single location.

Figure 9:
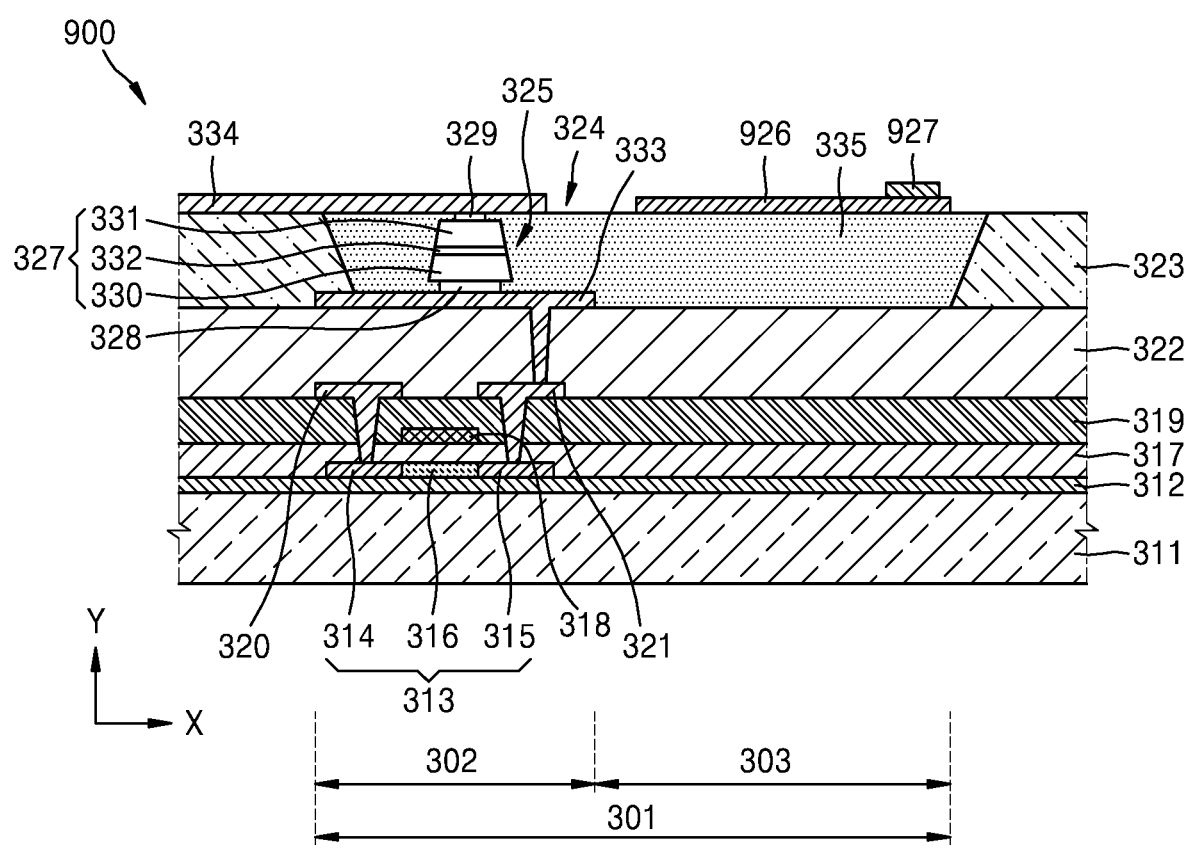
FIG. 9 is a cross-sectional view of another exemplary embodiment of a single sub-pixel.

Referring to FIG. 9, the sub-pixel area 301 of the display device 900 may include the first area 302 in which the LED 325 is placed and the second area 303 in which a touch sensor electrode 926 is placed. The filling layer 335 may be filled in the opening 324 which is defined by removing the portion of the bank 323.

The touch sensor electrode 926 may be arranged on the filling layer 335. The touch sensor electrode 926 and the second electrode 334 may be arranged on the same layer. A touch sensor wiring 927 may be arranged on the touch sensor electrode 926. The touch sensor wiring 927 may be directly connected to the touch sensor electrode 926.

Figure 10:
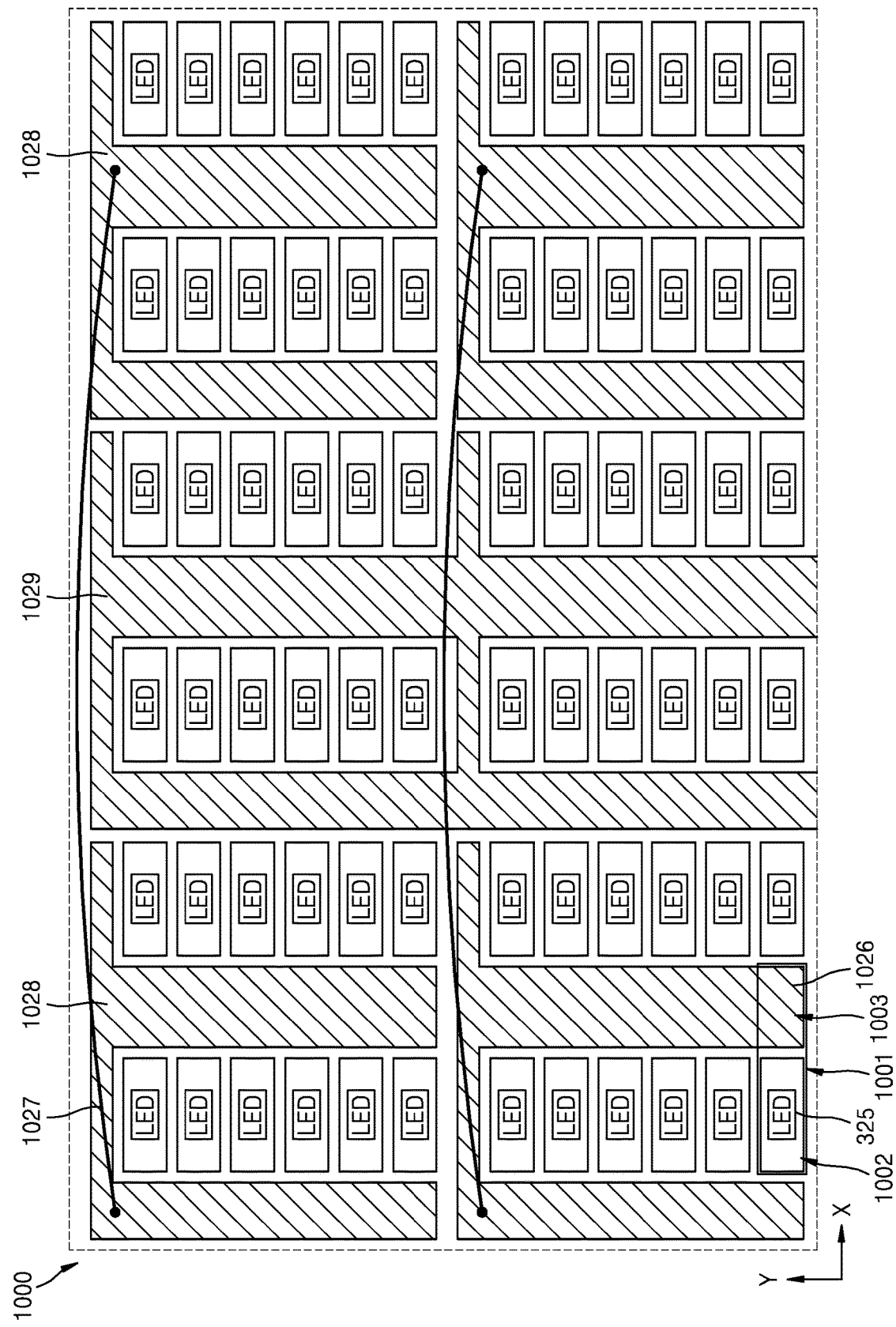
FIG. 10 is a plan view of another exemplary embodiment of an arrangement of an LED and a touch sensor electrode.

FIG. 10 is a plan view of an arrangement of the LED 325 and a touch sensor electrode 1026 according to another exemplary embodiment.

Referring to FIG. 10, a display device 1000 may include a plurality of sub-pixel areas 1001. The sub-pixel areas 1001 may be separated from each other in X-axis and the Y-axis directions. The sub-pixel area 1001 may include a first area 1002 in which the LED 325 is placed and a second area 1003 in which the touch sensor electrode 1026 is placed. The touch sensor electrode 1026 may extend to an adjacent sub-pixel area 1001.

According to an exemplary embodiment, the touch sensor electrode 1026 may have a mutual-capacitance sensing structure. The touch sensor electrode 1026 may be an electrode which senses the capacitance change generated between a first touch electrode 1028 and a second touch electrode 1029. The first touch electrode 1028 and the second touch electrode 1029 may be arranged on the same layer.

The first touch electrode 1028 and the second touch electrode 1029 may be alternately arranged in the X-axis direction. The pair of first touch electrodes 1028, which are separated from each other with the second touch electrode 1029 therebetween in the X-axis direction, may be electrically connected to each other via a connecting wiring 1027 which is arranged on a different layer with respect to the first touch electrode 1028. According to an exemplary embodiment, the connecting wiring 1027 may include the same material as that of at least one of the gate electrode, the source electrode, and the drain electrode. In another exemplary embodiment, the connecting wiring 1027 may be electrically connected to any one of the gate electrode, the source electrode, and the drain electrode.

The second touch electrodes 1029 may be respectively connected to separate touch sensor wirings, or may be directly connected to a touch integrated circuit ("IC") on one edge of the display device 1000.

Figure 11:
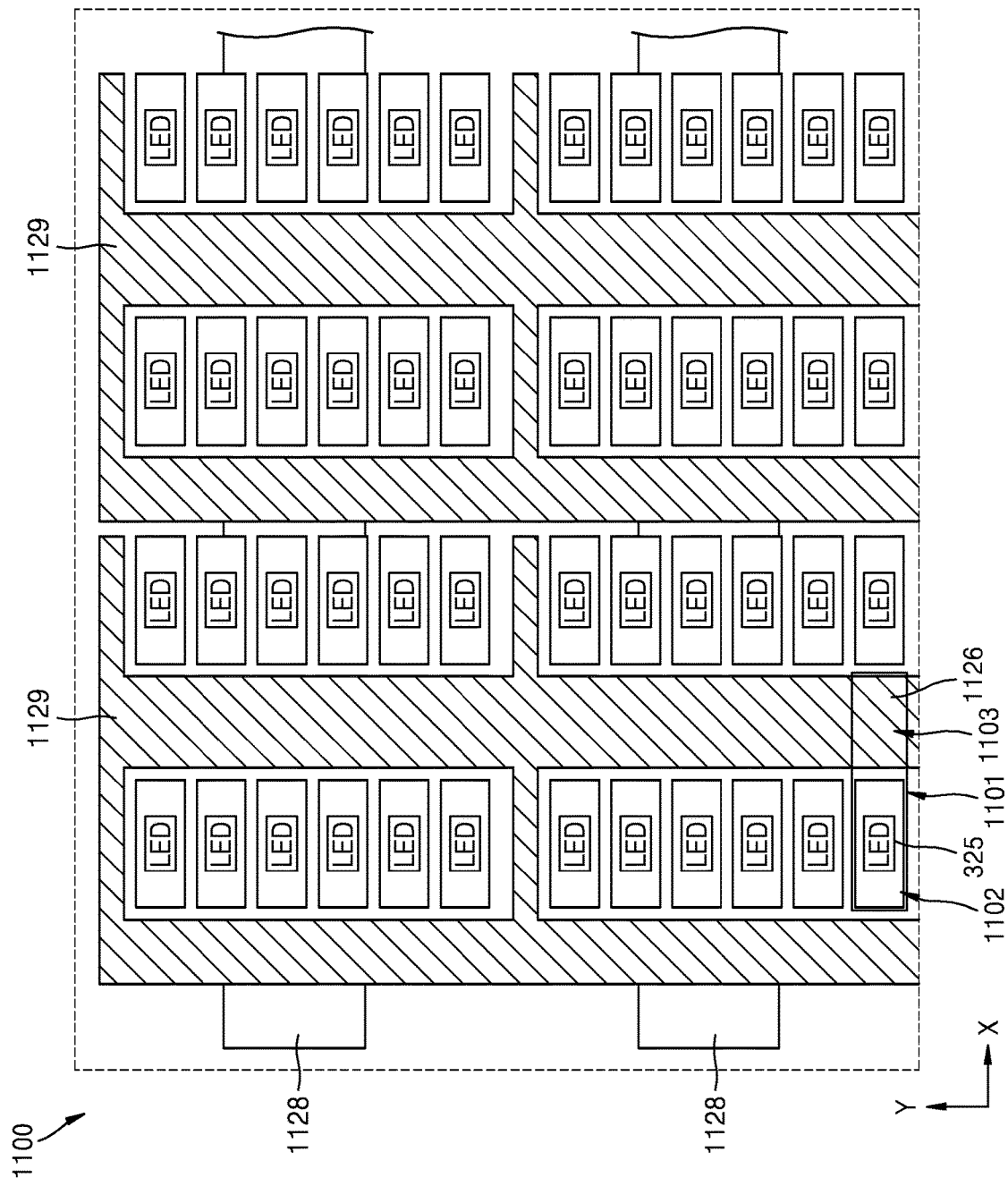
FIG. 11 is a plan view of another exemplary embodiment an arrangement of an LED and a touch sensor electrode.
Figure 12:
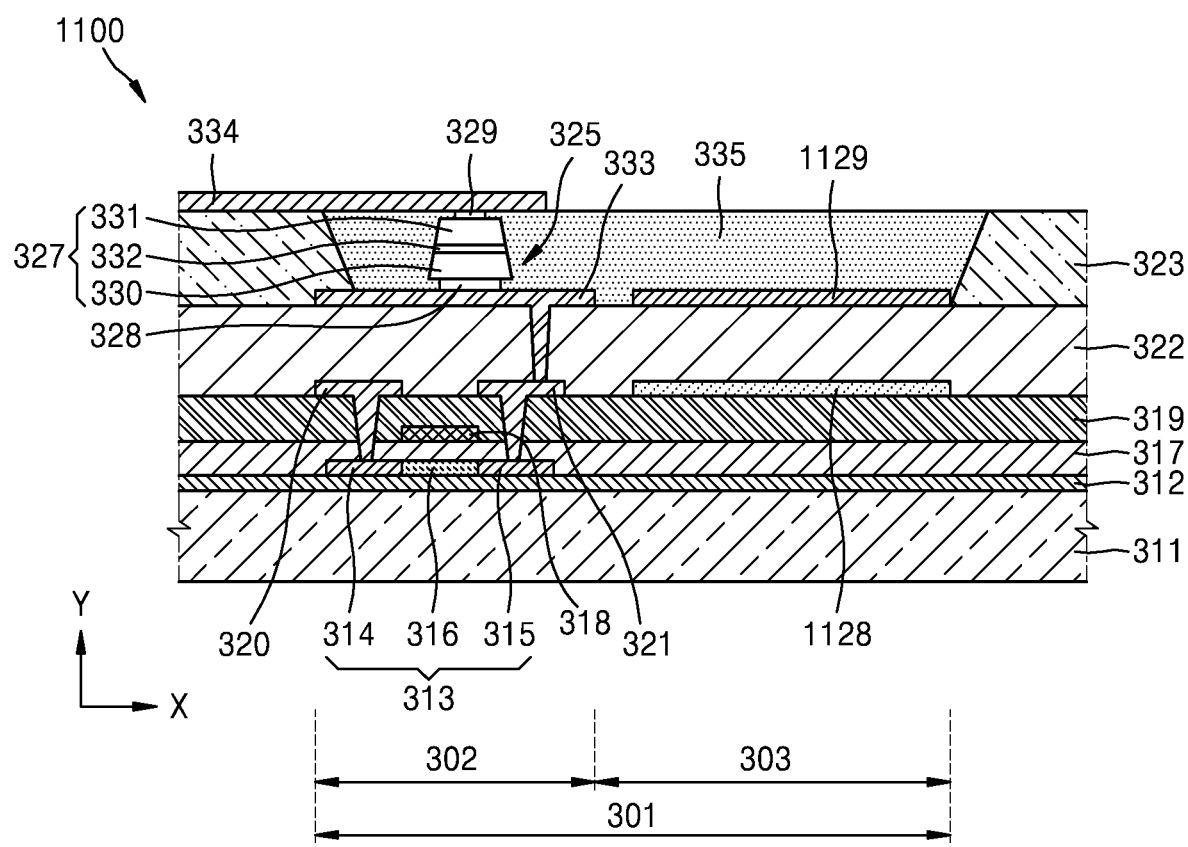
FIG. 12 is a cross-sectional view of a single sub-pixel in FIG. 11.

FIG. 11 is a plan view of an arrangement of an LED and a touch sensor electrode according to another exemplary embodiment, and FIG. 12 is a cross-sectional view of a single sub-pixel in FIG. 11.

Referring to FIGS. 11 and 12, the display device 1100 may include a plurality of sub-pixel areas 1101. The sub-pixel areas 1101 may be separated from each other in the X-axis and the Y-axis directions. The sub-pixel area 1101 may include a first area 1102 in which the LED 325 is placed and a second area 1103 in which a touch sensor electrode 1126 is placed. The touch sensor electrode 1126 may extend to an adjacent sub-pixel area 1101.

According to an exemplary embodiment, the touch sensor electrode 1126 may have the mutual-capacitance sensing structure. The touch sensor electrode 1126 may include a first touch electrode 1128 and a second touch electrode 1129. The first touch electrode 1128 and the second touch electrode 1129 may be alternately arranged in the X-axis direction. Unlike as illustrated in FIG. 10, the first touch electrode 1128 and the second touch electrode 1129 may be separated from each other on different layers.

The first touch electrode 1128, which may be a metal electrode, and a single electrode arranged on the TFT may be a metal electrode arranged on the same layer. In an exemplary embodiment, the first touch electrode 1128 and the source electrode 320 or the drain electrode 321 may be arranged on the same layer, for example. The first touch electrode 1128 may include the same material in the same process as that of the source electrode 320 or the drain electrode 321. In another exemplary embodiment, the first touch electrode 1128, which may be the metal electrode, and the gate electrode 318 may be arranged on the same layer.

The second touch electrode 1129 and the first electrode 333 may be arranged on the same layer. The second touch electrode 1129 may include the same material in the same process as that of the first electrode 333. In another exemplary embodiment, the second touch electrode 1129 and the second electrode 334 may be arranged on the same layer and may include the same material in the same process.

In another exemplary embodiment, the first touch electrode 1128 may include a separate metal layer, for example, a transparent conductive layer, and the second touch electrode 1129 and at least one of the gate electrode 318, the source electrode 320, the drain electrode 321, the first electrode 333, and the second electrode 334 may be arranged on the same layer.

Figure 13:
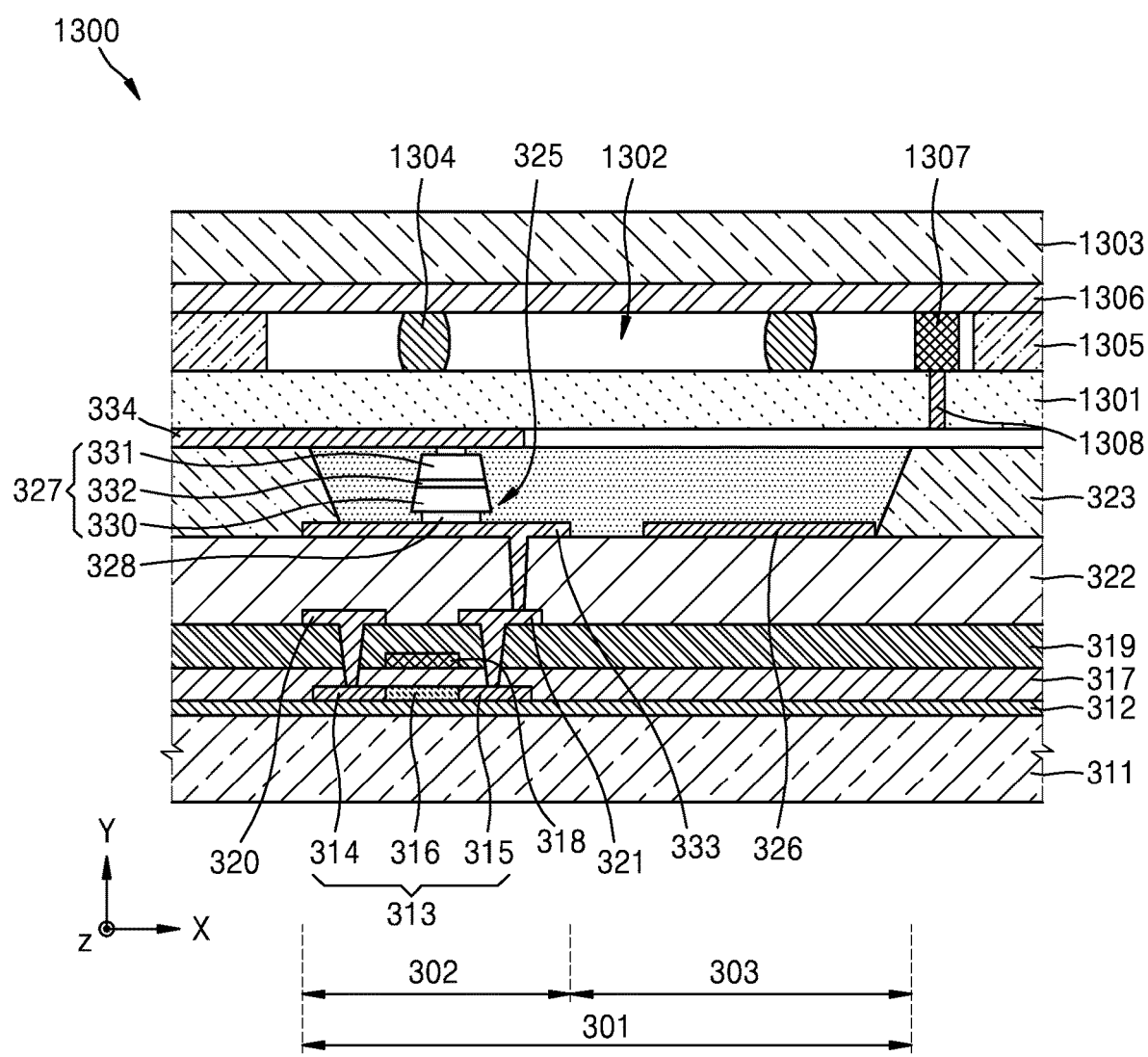
FIG. 13 is a cross-sectional view of another exemplary embodiment of a display device.

FIG. 13 is a cross-sectional view of a display device 1300 according to another exemplary embodiment.

Referring to FIG. 13, a first function layer 1301 encapsulating the sub-pixel area 301 may be arranged on the display substrate 311. According to an exemplary embodiment, the first function layer 1301 may be an encapsulating layer, but it is not limited thereto. A second function layer 1303 may be arranged above the first function layer 1301 with a medium layer 1302 therebetween. The second function layer 1303 may be a window cover, but it is not limited thereto.

The medium layer 1302 may receive pressure caused by a user's contact and may be a material with a cushion function. According to an exemplary embodiment, the medium layer 1302 may be an air layer, but it is not limited thereto. A spacer 1304 maintaining a cell gap may be arranged between the first function layer 1301 and the second function layer 1303. A sealant 1305 may be applied to edges where the first function layer 1301 and the second function layer 1303 may face.

The sub-pixel area 301 may include the first area 302 in which the LED 325 is placed and the second area 303 in which the touch sensor electrode 326 is placed. The touch sensor electrode 326 and the first electrode 333 may be arranged on the same layer. In another exemplary embodiment, the touch sensor electrode 326 and the second electrode 334 may be arranged on the same layer.

The touch sensor electrode 326 may correspond to an electrode which senses the capacitance change in the X-axis and the Y-axis crossing the X-axis. A force sensing electrode 1306, which forms capacitance with the touch sensor electrode 326 in a Z-axis perpendicular to the X-axis and the Y-axis and senses pressure in accordance with the capacitance change, may be further arranged on the display substrate 311. According to an exemplary embodiment, the force sensing electrode 1306 may be arranged on one surface of the second function layer 1303 facing the first function layer 1301.

Since capacitance is generated between the touch sensor electrode 326 and the force sensing electrode 1306, sensing the capacitance change in the Z-axis may be possible. In detail, when an input tool is pressed, an applied force may be sensed depending on the capacitance change between the touch sensor electrode 326 and the force sensor electrode 1306.

The force sensor electrode 1306 may patterned with a particular pattern on the second function layer 1303. In detail, the force sensor electrode 1306 may be patterned with a plurality of patterns having different areas from each other, to sense each location in accordance with the force applied to the display device 1300. In another exemplary embodiment, the force sensor electrode 1306 may be entirely disposed on the second function layer 1303, to sense the force only.

In an exemplary embodiment, the force sensor electrode 1306 may include conductive polymer materials such as poly 3,4-ethylenedioxy thiophene ("PEDOT"), polyacetylene, and polypyrrole. Since the force sensor electrode 1306 has resistance per unit area more than 100 times larger than that of the transparent conductive layer such as an ITO layer, while maintaining electrical conductivity, the force sensor electrode 1306 may be applicable to an electrode of the TSP.

A connector 1307 which is electrically connected to the force sensor electrode 1306 may be arranged between the first function layer 1301 and the second function layer 1303. The connector 1307 may be connected to a pad on the display substrate 311 via the contact hole 1308 defined in the first function layer 1301 and may transfer a force sensor signal to the external device.

Likewise, the structure, in which locations in the X-axis and the Y-axis are sensed by using the touch sensor electrode 326 and a force in the Z-axis is sensed by using the force sensor electrode 1306, may be applied to various display devices.

Figure 14:
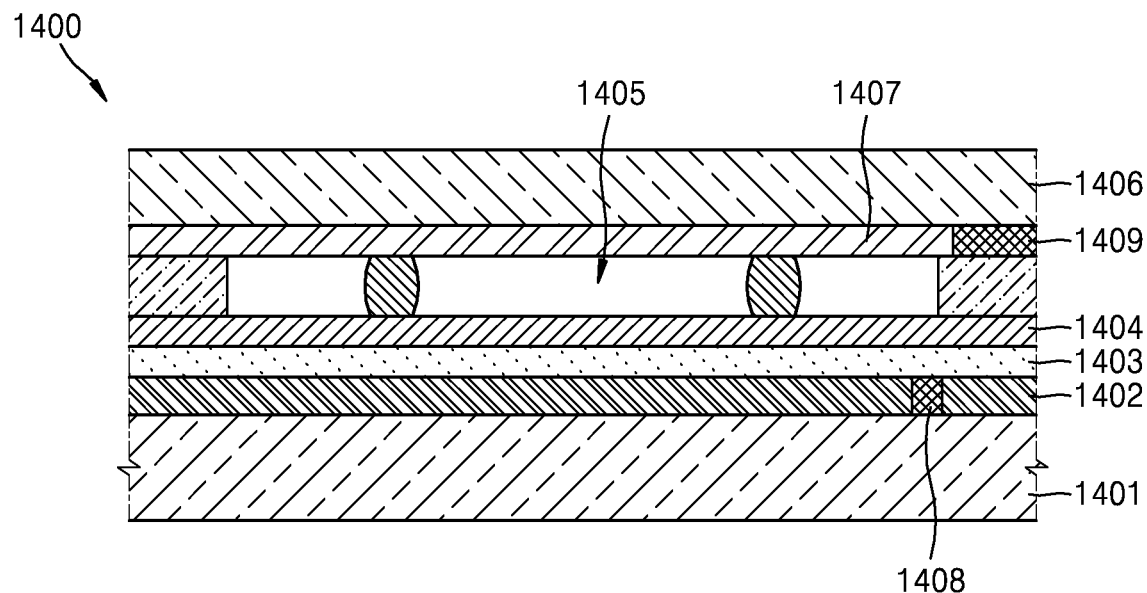
FIG. 14 is a cross-sectional view of another exemplary embodiment of a display device.

Referring to FIG. 14, a display device 1400 may be an organic light-emitting display device. In detail, a display unit 1402 including the TFT and an organic LED may be arranged on a display substrate 1401, a touch sensor electrode 1403 may be arranged on the display unit 1402, and a first function layer 1404 corresponding to encapsulation may be arranged on the touch sensor electrode 1403. A second function layer 1406, which corresponds to the window cover, may be arranged above the first function layer 1404 with a medium layer 1405 therebetween. A force sensor electrode 1407 may be arranged on one surface of the second function layer 1406 facing the first function layer 1404.

The touch sensor electrode 1403 may be connected to a pad on the display substrate 1401 via a contact hole 1408 defined in the display unit 1402 and may transfer the sensor signal to the external device. In addition, the force sensor electrode 1407 may be connected to a connector 1409 and may transfer the force sensor signal to the external device.

The structure described above may sense the force applied in accordance with the capacitance change between the touch sensor electrode 1403 and the force sensor electrode 1407.

Figure 15:
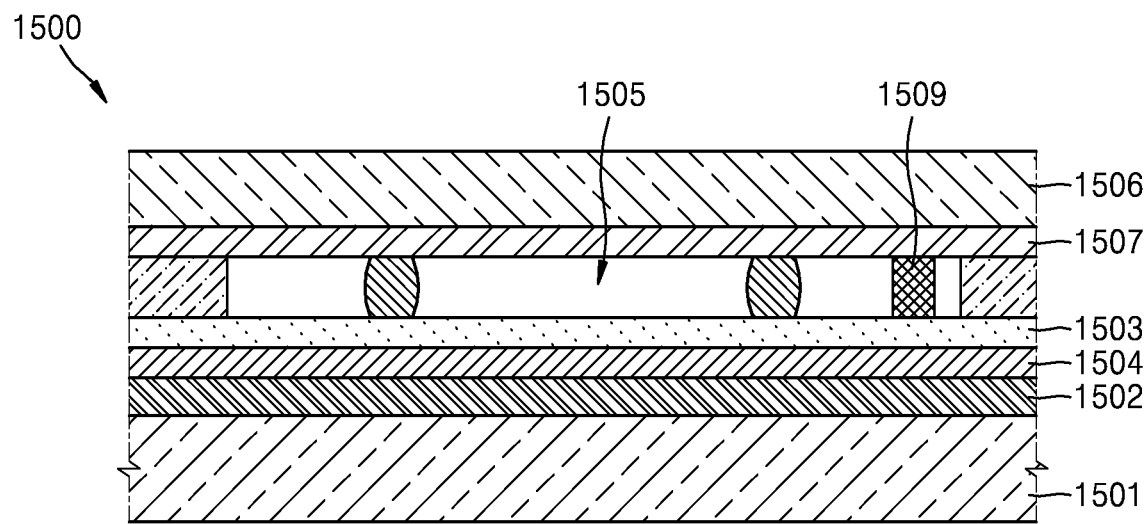
FIG. 15 is a cross-sectional view of another exemplary embodiment of a display device.

Referring to FIG. 15, a display device 1500 may be an organic light-emitting display device. In detail, a display unit 1502 including the TFT and the organic LED may be arranged on the display substrate 1501. Unlike as illustrated in FIG. 14, a first function layer 1504 corresponding to encapsulation may be arranged on the display unit 1502. A touch sensor electrode 1503 may be arranged on the first function layer 1504. A second function layer 1506, which corresponds to the window cover, may be arranged above the touch sensor electrode 1503 with a medium layer 1505 therebetween. A force sensor electrode 1507 may be arranged on one surface of the second function layer 1506. The force sensor electrode 1507 may be connected to a connector 1509 and may transfer the force sensor signal to the external device.

The structure described above may sense the force applied in accordance with the capacitance change between the touch sensor electrode 1503 and the force sensor electrode 1507.

Figure 16:
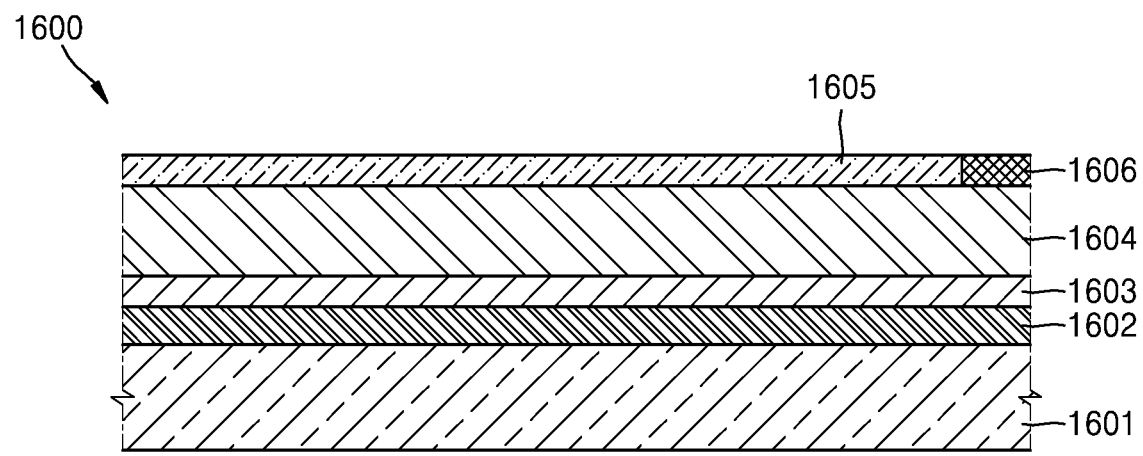
FIG. 16 is a cross-sectional view of another exemplary embodiment of a display device.

Referring to FIG. 16, a display device 1600 may be a liquid crystal display device. In detail, a display unit 1602 including a crystal display element may be arranged on the display substrate 1601, and a touch sensor electrode 1603 may be arranged on the display unit 1602. A function layer 1604, which corresponds to a color filter substrate, may be arranged on the touch sensor electrode 1603, and a force sensor electrode 1605 may be arranged on the function layer 1604. The force sensor electrode 1605 may be connected to a connector 1606 and may transfer the force sensor signal to the external device.

The structure described above may sense the applied force via the capacitance change between the touch sensor electrode 1603 and the force sensor electrode 1605.

Figure 17:
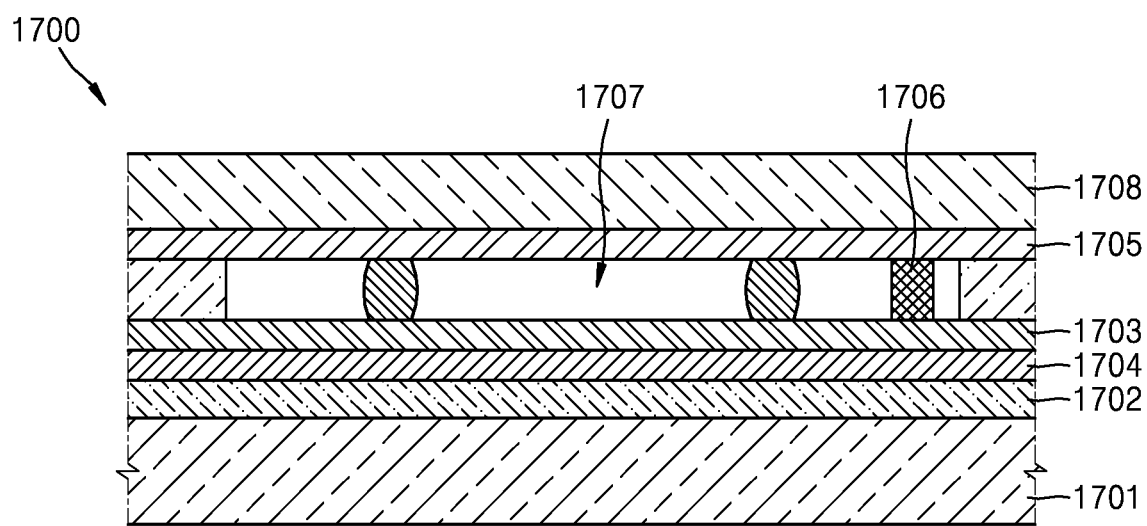
FIG. 17 is a cross-sectional view of another exemplary embodiment of a display device.

Referring to FIG. 17, a display device 1700 may be a liquid crystal display device. In detail, a display unit 1702 including a crystal display element may be arranged on a display substrate 1701. Unlike as illustrated in FIG. 16, a first function layer 1704, which corresponds to a color filter substrate, may be arranged on the display unit 1702 and a touch sensor electrode 1703 may be arranged on the first function layer 1704. A second function layer 1708 such as the window cover may be arranged above the touch sensor electrode 1703 with a medium layer 1707 therebetween. A force sensor electrode 1705 may be arranged on one surface of the second function layer 1708. The force sensor electrode 1705 may be connected to a connector 1706 and may transfer the force sensor signal to the external device.

The structure described above may sense the applied force via the capacitance change between the touch sensor electrode 1703 and the force sensor electrode 1705.

Figure 18:
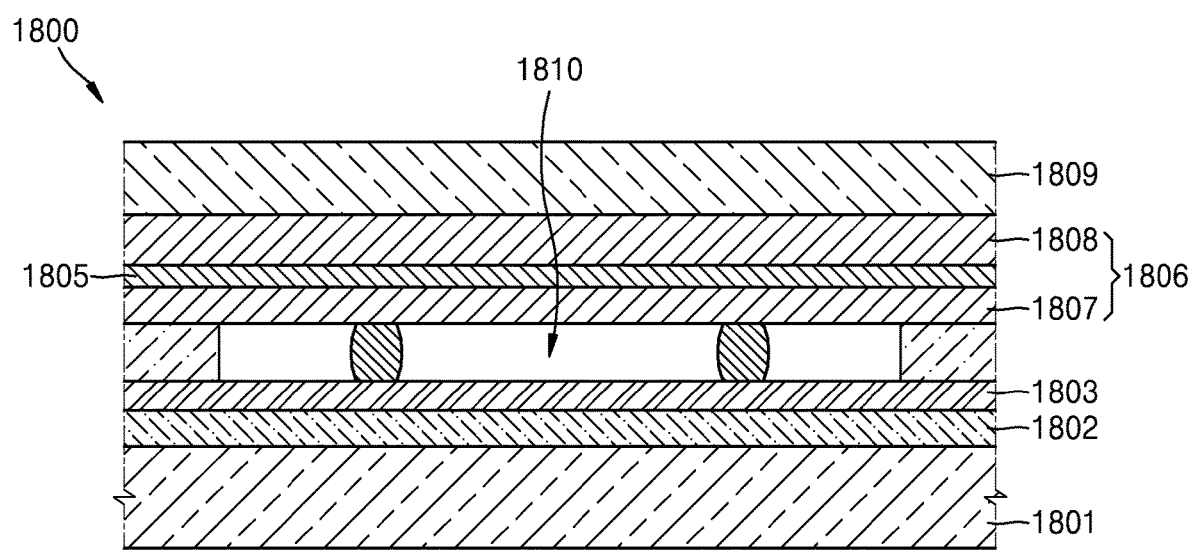
FIG. 18 is a cross-sectional view of another exemplary embodiment of a display device.

Referring to FIG. 18, a display device 1800 may include a display substrate 1801. A display unit 1802 may be arranged on the display substrate 1801. The display unit 1802 may include a micro-LED. A touch sensor electrode 1803 may be arranged on the display unit 1802. In another exemplary embodiment, the display unit 1802 may include a LCD element, or an organic LED. In another exemplary embodiment, a function layer such as a color filter substrate or an encapsulation layer may be arranged on the display 1802.

A function layer 1809, which corresponds to the window cover, may be arranged above the touch sensor electrode 1803 with a medium layer 1810 therebetween. A force sensor electrode 1805 may be arranged on a function layer 1809 facing the touch sensor electrode 1803.

According to an exemplary embodiment, the medium layer 1810 may include an air layer. A refractive index matching layer ("RIML") 1806 may be arranged on at least one surface of the force sensor electrode 1805 to improve reflective index affected by the air layer. The RIML 1806 may include a first RIML 1807 arranged on one surface of the force sensor electrode 1805 facing the touch sensor electrode 1803 and a second RIML 1808 arranged on the other surface of the force sensor electrode 1805 facing the function layer 1809.

In an exemplary embodiment, the RIML 1806 may include silicon oxide ($SiO_2$) or silicon nitride ($SiN_x$), for example. The refractive index of the first RIML 1807 and that of the second RIML 1808 may be less than that of the force sensor electrode 1805. The RIML 1806 with a low refractive index and the force sensor electrode 1805 with a high refractive index are alternately arranged on the medium layer 1810. Thus, the refractive index of the display device 1800 may be improved and poor show-through of the touch sensor electrode 1803 may be improved.

Figure 19:
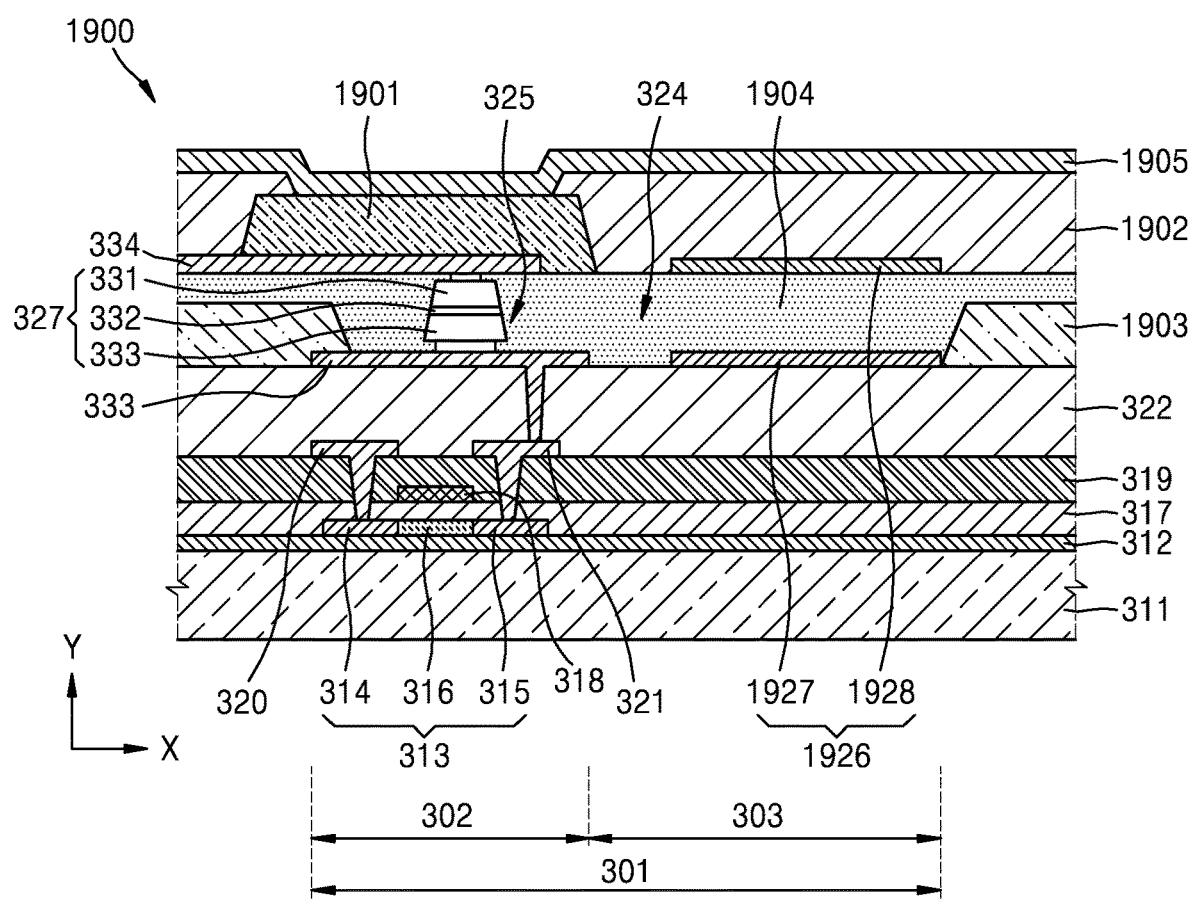
FIG. 19 is a cross-sectional view of another exemplary embodiment of a single sub-pixel.

FIG. 19 is a cross-sectional view of a single sub-pixel according to another exemplary embodiment.

Referring to FIG. 19, the display device 1900 may include the plurality of sub-pixel areas 301. The sub-pixel area 301 may include the first area 302 in which the LED 325 is placed and the second area 303 in which the touch sensor electrode 1926 is placed. The touch sensor electrode 1926 may extend to an adjacent sub-pixel area 301.

According to an exemplary embodiment, the touch sensor electrode 1926 may include a first touch electrode 1927 and a second touch electrode 1928. The first touch electrode 1927 and the first electrode 333 may be arranged on the same layer. In another exemplary embodiment, the first touch electrode 1927 and at least one of the gate electrode 318, the source electrode 320, and the drain electrode 321, which are arranged on the TFT, may be arranged on the same layer.

A first bank 1903 may be arranged on the circumference of the sub-pixel area 301. The LED 325 and the first touch electrode 1927 may be arranged in the opening 324 with a portion of the first bank 1903 removed therefrom.

A second bank 1904 may be further arranged on the first bank 1903. The second bank 1904 may embed the LED 325 and the first touch electrode 1927. The second bank 1904 may planarize the top surface of the LED 325.

The second electrode 334 may be electrically connected to the LED 325 on the second bank 1904. The second touch electrode 1928 and the second electrode 333 may be arranged on the same layer. The touch sensor electrode 1926 may correspond to an electrode which senses the capacitance change between the first touch electrode 1927 and the second touch electrode 1928.

A color filter 1901 may be arranged over the LED 325. The color filter 1901 may transform light emitted from the LED 325 or increase color purity.

A black matrix 1902 may be arranged on the circumference of the color filter 1901. The black matrix 1902 may surround the circumference of the LED 325. In another exemplary embodiment, the black matrix 1902 may be arranged between adjacent sub-pixel areas 301. Since the color filter 1901 and the black matrix 1902 are arranged, a polarization plate is not needed and reflection of external light may be improved.

An encapsulation layer 1905 may be arranged on the outermost circumference of the display substrate 311 to protect each element arranged on the display substrate 311. The encapsulation layer 1905 may include a lamination of at least one of inorganic materials and at least one of organic materials. In another exemplary embodiment, the encapsulation layer 1905 may include an inorganic material.

Figure 20:
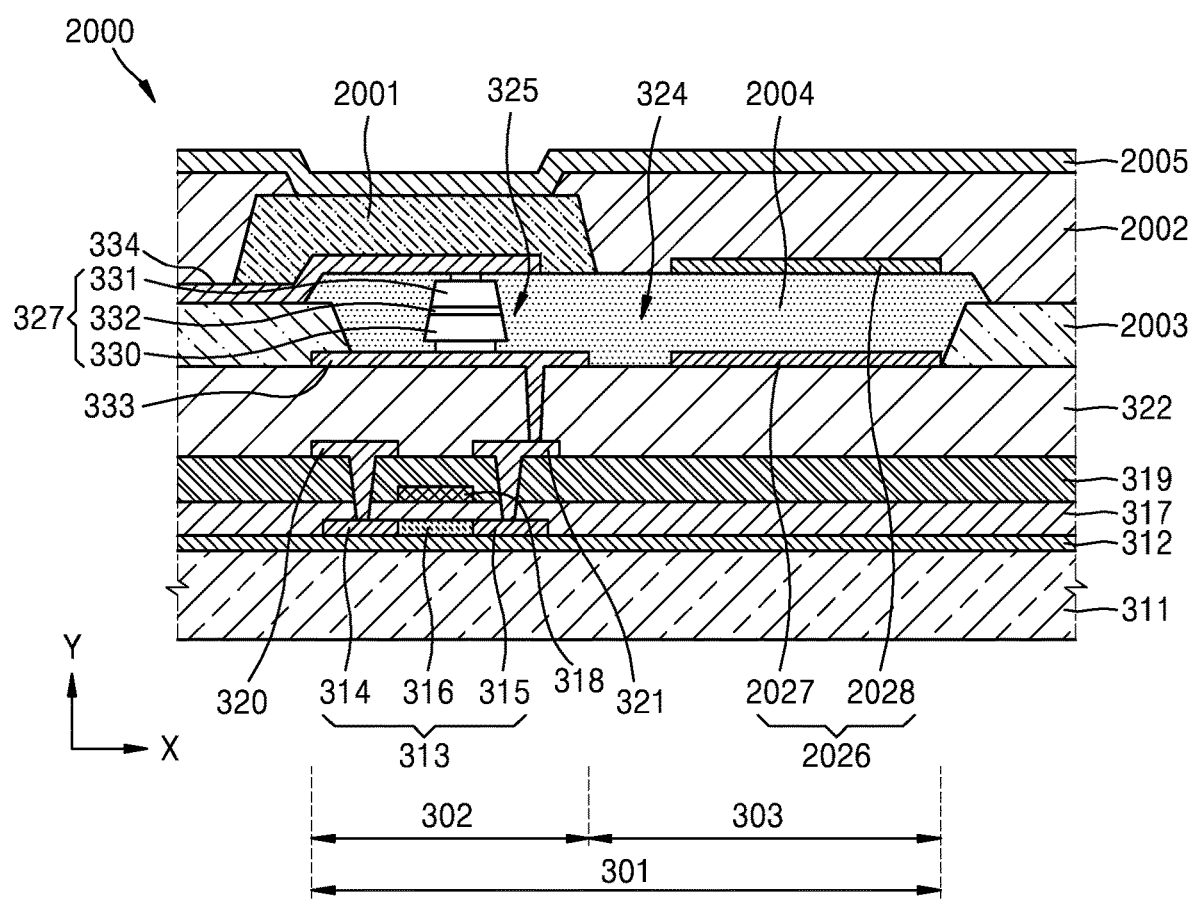
FIG. 20 is a cross-sectional view of another exemplary embodiment of a single sub-pixel.

FIG. 20 is a cross-sectional view of a single sub-pixel according to another exemplary embodiment.

Referring to FIG. 20, the display device 2000 may include the plurality of sub-pixel areas 301. The sub-pixel area 301 may include the first area 302 in which the LED 325 is placed and the second area 303 in which a touch sensor electrode 2026 is placed. The touch sensor electrode 2026 may extend to an adjacent sub-pixel area 301. According to an exemplary embodiment, the touch sensor electrode 2026 may include a first touch electrode 2027 and a second touch electrode 2028. The first touch electrode 2027 and the first electrode 333 may be arranged on the same layer. In another exemplary embodiment, the first touch electrode 2027 and at least one of the gate electrode 318, the source electrode 320, and the drain electrode 321, which are provided in the TFT, may be arranged on the same layer.

A first bank 2003 may be arranged on the circumference of the sub-pixel area 301. The first bank 2003 may extend to an adjacent sub-pixel area 301. The LED 325 and the first touch electrode 2027 may be arranged in the opening 324 which is provided by removing the portion of the first bank 2003.

A second bank 2004 may be further arranged on the first bank 2003. The second bank 2004 may embed the LED 325 and the first touch electrode 2027. The second bank 2004 may be independently arranged on respective sub-pixel areas 301 such that the LEDs 325 are embedded.

According to an exemplary embodiment, the second bank 2004 may extend from the first area 302 in which the LED 325 is placed to the second area 302 in which the touch sensor electrode 2026 is placed. In another exemplary embodiment, the second bank 2004 may be arranged on only the first area 302 including the LED 325.

According to an exemplary embodiment, the second bank 2004 may include a scattering material or a color conversion material.

The second electrode 334 may be electrically connected to the LED 325 on the second bank 2004. A second touch electrode 2028 and the second electrode 334 may be arranged on the same layer. The second touch electrode 2028 may correspond to an electrode which senses the capacitance change between the first touch electrode 2027 and the second touch electrode 2028.

A color filter 2001 may be arranged above the LED 325. The color filter 2001 may transform light emitted from the LED 325 or increase color purity.

A black matrix 2002 may be arranged on the circumference of the color filter 2001. According to an exemplary embodiment, the black matrix 2002 may surround the circumference of the LED 325. In another exemplary embodiment, the black matrix 2002 may be arranged between adjacent sub-pixel areas 301.

An encapsulation layer 2005 may be arranged on the outermost circumference of the display substrate 311 to protect each element arranged on the display substrate 311. The encapsulation layer 2005 may include a lamination of at least one of inorganic materials and at least one of organic materials.

It should be understood that the exemplary embodiments described herein should be considered in a descriptive sense only and not for purposes of limitation. Descriptions of features or exemplary embodiments within each exemplary embodiment should typically be considered as available for other similar features or exemplary embodiments in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A light-emitting diode ("LED") device, comprising:
a flexible polymer substrate;
a buffer layer on the flexible polymer substrate, substantially totally covering a top surface of the flexible polymer substrate;
a plurality of thin film transistors ("TFT"s) on the buffer layer, each TFT comprising an active layer, a gate electrode, a source electrode, and a drain electrode;
a plurality of LEDs, each electrically connected to one of the plurality of TFTs;
a touch sensor comprising first sensor electrodes and second sensor electrodes on the flexible polymer substrate;
connecting wires on the flexible polymer substrate; and
dummy patterns, which are in a floating state and disposed on the flexible polymer substrate;
wherein a pair of first sensor electrodes are electrically connected to each other via one of the connecting wires,
wherein the touch sensor senses a capacitance change generated between one of the first sensor electrodes and one of the second sensor electrodes,
wherein the first sensor electrodes, the second sensor electrodes, and the dummy patterns are arranged on the same layer,
wherein the touch sensor, the connecting wires, the source electrode, the drain electrode and the dummy patterns comprise metallic materials,
wherein, in a plan view, a first portion of the one of the first sensor electrodes mainly extends in a first direction and a second portion of the one of first sensor electrodes mainly extends in a second direction intersecting the first direction,
wherein, in a plan view, the second portion of the one of the first sensor electrodes is disposed between a pair of LEDs from among the plurality of LEDs immediately next to each other in the first direction and overlaps the first portion of the one of the first sensor electrodes in the second direction, and
wherein, in a plan view, a side of one of the pair of LEDs faces the second portion of the one of the first sensor electrodes and an opposite side of the one of the pair of LEDs opposite to the side of the one of the pair of LEDs in the first direction is exposed to the one of the second sensor electrodes.

2. A mobile phone with display, comprising:
a flexible polymer substrate;
a buffer layer on the flexible polymer substrate, substantially totally covering a top surface of the flexible polymer substrate;
a plurality of thin film transistors ("TFT"s) on the buffer layer, each TFT comprising an active layer, a gate electrode, a source electrode, and a drain electrode;
a plurality of light emitting diodes ("LED"s), each electrically connected to one of the plurality of TFTs;
a touch sensor comprising first sensor electrodes and second sensor electrodes on the flexible polymer substrate;
connecting wires on the flexible polymer substrate; and
dummy patterns, which are in a floating state and disposed on the flexible polymer substrate;
wherein a pair of first sensor electrodes are electrically connected to each other via one of the connecting wires,
wherein the touch sensor senses a capacitance change generated between one of the first sensor electrodes and one of the second sensor electrodes,
wherein the first sensor electrodes, the second sensor electrodes, and the dummy patterns are arranged on the same layer,
wherein the touch sensor, the connecting wires, the source electrode, the drain electrode and the dummy patterns comprise metallic materials,
wherein, in a plan view, a first portion of the one of the first sensor electrodes mainly extends in a first direction and a second portion of the one of first sensor electrodes mainly extends in a second direction intersecting the first direction,
wherein, in a plan view, the second portion of the one of the first sensor electrodes is disposed between a pair of LEDs from among the plurality of LEDs immediately next to each other in the first direction and overlaps the first portion of the one of the first sensor electrodes in the second direction, and
wherein, in a plan view, a side of one of the pair of LEDs faces the second portion of the one of the first sensor electrodes and an opposite side of the one of the pair of LEDs opposite to the side of the one of the pair of LEDs in the first direction is exposed to the one of the second sensor electrodes.

3. An organic light emitting diode ("LED") device, comprising:
a substrate;
a plurality of thin film transistors ("TFT"s) on the buffer layer, each TFT comprising an active layer, a gate electrode, a source electrode, and a drain electrode;
a plurality of organic LEDs, each electrically connected to one of the plurality of TFTs;
a touch sensor comprising first sensor electrodes, second sensor electrodes, and connecting wires on the substrate; and
dummy patterns, which are in a floating state and disposed on the substrate,
wherein a pair of first sensor electrodes are electrically connected to each other via one of the connecting wires,
wherein the first sensor electrodes, the second sensor electrodes, and the dummy patterns are arranged on the same layer,
wherein the first sensor electrodes, the second sensor electrodes, the connecting wires, the source electrode, the drain electrode, and the dummy patterns comprise metallic materials,
wherein a first portion of the one of the first sensor electrodes mainly extends in a first direction in a plan view,
wherein a second portion of the one of the first sensor electrodes mainly extends in a second direction intersecting the first direction in a plan view,
wherein, in a plan view, the second portion of the one of the first sensor electrodes is disposed between a pair of organic LEDs from among the plurality of organic LEDs immediately next to each other in the first direction and overlaps the first portion of the one of the first sensor electrodes in the second direction,
wherein a side of one of the pair of organic LEDs faces the second portion of the one of the first sensor electrodes in a plan view, and wherein an opposite side of the one of the pair of organic LEDs opposite to the side of the one of the pair of organic LEDs in the first direction is exposed to the one of the second sensor electrodes in a plan view.

4. The organic LED device of claim 3, wherein the touch sensor senses a capacitance change generated between the one of the first sensor electrodes and the one of the second sensor electrodes.

5. A mobile phone with display, comprising:
a substrate;
a plurality of thin film transistors ("TFT"s) on the buffer layer, each TFT comprising an active layer, a gate electrode, a source electrode, and a drain electrode;
a plurality of organic light emitting diodes ("LED"s), each electrically connected to one of the plurality of TFTs;
a touch sensor comprising first sensor electrodes, second sensor electrodes, and connecting wires on the substrate; and
dummy patterns, which are in a floating state and disposed on the substrate,
wherein a pair of first sensor electrodes are electrically connected to each other via one of the connecting wires,
wherein the first sensor electrodes, the second sensor electrodes, and the dummy patterns are arranged on the same layer,
wherein the first sensor electrodes, the second sensor electrodes, the connecting wires, the source electrode, the drain electrode, and the dummy patterns comprise metallic materials,
wherein a first portion of the one of the first sensor electrodes mainly extends in a first direction in a plan view,
wherein a second portion of the one of the first sensor electrodes mainly extends in a second direction intersecting the first direction in a plan view,
wherein, in a plan view, the second portion of the one of the first sensor electrodes is disposed between a pair of organic LEDs from among the plurality of organic LEDs immediately next to each other in the first direction and overlaps the first portion of the one of the first sensor electrodes in the second direction,
wherein a side of one of the pair of organic LEDs faces the second portion of the one of the first sensor electrodes in a plan view, and
wherein an opposite side of the one of the pair of organic LEDs opposite to the side of the one of the pair of organic LEDs in the first direction is exposed to the one of the second sensor electrodes in a plan view.

6. The mobile phone with display of claim 5, wherein the touch sensor senses a capacitance change generated between the one of the first sensor electrodes and the one of the second sensor electrodes.

7. An organic light emitting diode ("LED") device, comprising:
a display substrate;
a display unit comprising a plurality of thin film transistors ("TFT"s) and a plurality of organic LEDs on the display substrate;
a touch sensor comprising first sensor electrodes, second sensor electrodes, and connecting wires on the display unit;
a pad on the display substrate and electrically connected to the touch sensor; and
a window disposed on the touch sensor,
wherein each TFT comprises an active layer, a gate electrode, a source electrode, and a drain electrode;
wherein a pair of first sensor electrodes are electrically connected to each other one of the connecting wires,
wherein the first sensor electrodes and the second sensor electrodes are arranged on the same layer,
wherein the first sensor electrodes, the second sensor electrodes, the connecting wires, the source electrode, and the drain electrode comprise metallic materials,
wherein a first portion of the one of the first sensor electrodes mainly extends in a first direction in a plan view,
wherein a second portion of the one of the first sensor electrodes mainly extends in a second direction intersecting the first direction in a plan view,
wherein, in a plan view, the second portion of the one of the first sensor electrodes is disposed between a pair of organic LEDs from among the plurality of organic LEDs immediately next to each other in the first direction and overlaps the first portion of the one of the first sensor electrodes in the second direction,
wherein a side of one of the pair of organic LEDs faces the second portion of the one of the first sensor electrodes in a plan view, and
wherein an opposite side of the one of the pair of organic LEDs in the first direction is exposed to the one of the second sensor electrodes in a plan view.

8. The organic LED device of claim 7, wherein the touch sensor senses a capacitance change generated between the one of the first sensor electrodes and the one of the second sensor electrodes.

9. The organic LED device of claim 8, wherein the touch sensor is electrically connected to the pad via a contact hole defined in the display unit.

10. The organic LED device of claim 7, further comprising dummy patterns, which are in a floating state and disposed on the display substrate.

11. The organic LED device of claim 10, wherein the dummy patterns are arrange on the same layer as the first and second sensor electrodes.

12. The organic LED device of claim 10, wherein the dummy patterns comprise metallic materials.

13. A mobile phone with display, comprising:
a display substrate;
a display unit comprising a plurality of thin film transistors ("TFT"s) and a plurality of organic light emitting diodes ("LED"s) on the display substrate;
a touch sensor comprising first sensor electrodes, second sensor electrodes, and connecting wires on the display unit;
a pad on the display substrate and electrically connected to the touch sensor; and
a window disposed on the touch sensor,
wherein each TFT comprises an active layer, a gate electrode, a source electrode, and a drain electrode;
wherein a pair of first sensor electrodes are electrically connected to each other one of the connecting wires,
wherein the first sensor electrodes and the second sensor electrodes are arranged on the same layer,
wherein the first sensor electrodes, the second sensor electrodes, the connecting wires, the source electrode, and the drain electrode comprise metallic materials,
wherein a first portion of the one of the first sensor electrodes mainly extends in a first direction in a plan view,
wherein a second portion of the one of the first sensor electrodes mainly extends in a second direction intersecting the first direction in a plan view, wherein, in a plan view, the second portion of the one of the first sensor electrodes is disposed between a pair of organic LEDs from among the plurality of organic LEDs immediately next to each other in the first direction and overlaps the first portion of the one of the first sensor electrodes in the second direction, wherein a side of one of the pair of organic LEDs faces the second portion of the one of the first sensor electrodes in a plan view, and wherein an opposite side of the one of the pair of organic LEDs in the first direction is exposed to the one of the second sensor electrodes in a plan view.

14. The mobile phone with display of claim 13, wherein the touch sensor senses a capacitance change generated between the one of the first sensor electrodes and the one of the second sensor electrodes.

15. The mobile phone with display of claim 14, wherein the touch sensor is electrically connected to the pad via a contact hole defined in the display unit.

16. The mobile phone with display claim 13, further comprising dummy patterns, which are in a floating state and disposed on the display substrate.

17. The mobile phone with display claim 16, wherein the dummy patterns are arrange on the same layer as the first and second sensor electrodes.

18. The mobile phone with display claim 16, wherein the dummy patterns comprise metallic materials.

19. A mobile phone with display, comprising:
a display substrate;
a display unit comprising a plurality of thin film transistors ("TFT"s) and a plurality of light emitting diodes ("LED"s) on the display substrate;
a touch sensor comprising first sensor electrodes, second sensor electrodes, and connecting wires on the display unit;
a pad on the display substrate and electrically connected to the touch sensor; and
a window disposed on the touch sensor, wherein a first portion of the one of the first sensor electrodes mainly extends in a first direction in a plan view, wherein a second portion of the one of the first sensor electrodes mainly extends in a second direction intersecting the first direction in a plan view, wherein, in a plan view, the second portion of the one of the first sensor electrodes is disposed between a pair of LEDs from among the plurality of LEDs immediately next to each other in the first direction and overlaps the first portion of the one of the first sensor electrodes in the second direction, wherein a side of one of the pair of LEDs faces the second portion of the one of the first sensor electrodes in a plan view, and wherein an opposite side of the one of the pair of LEDs in the first direction is exposed to the one of the second sensor electrodes in a plan view.

20. The mobile phone with display of claim 19, wherein the touch sensor is electrically connected to the pad via a contact hole defined in the display unit.

21. The mobile phone with display of claim 20, wherein each TFT comprises an active layer, a gate electrode, a source electrode, and a drain electrode;
wherein a pair of first sensor electrodes are electrically connected to each other one of the connecting wires,
wherein the first sensor electrodes and the second sensor electrodes are arranged on the same layer,
wherein the first sensor electrodes, the second sensor electrodes, the connecting wires, the source electrode, and the drain electrode comprise metallic materials.

22. The mobile phone with display of claim 21, further comprising dummy patterns, which are in a floating state and disposed on the display substrate.

23. The mobile phone with display of claim 22, wherein the dummy patterns are arrange on the same layer as the first and second sensor electrodes.

24. The mobile phone with display of claim 23, wherein the dummy patterns comprise metallic materials.

* * * * *